(12) United States Patent
Urabe et al.

(10) Patent No.: US 10,483,458 B2
(45) Date of Patent: Nov. 19, 2019

(54) MAGNETORESISTIVE EFFECT DEVICE

(71) Applicant: TDK CORPORATION, Tokyo (JP)

(72) Inventors: Junichiro Urabe, Tokyo (JP); Tetsuya Shibata, Tokyo (JP); Atsushi Shimura, Tokyo (JP); Takekazu Yamane, Tokyo (JP); Tsuyoshi Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/764,848

(22) PCT Filed: Jun. 2, 2016

(86) PCT No.: PCT/JP2016/066343
§ 371 (c)(1),
(2) Date: Mar. 29, 2018

(87) PCT Pub. No.: WO2017/056560
PCT Pub. Date: Apr. 6, 2017

(65) Prior Publication Data
US 2018/0277749 A1 Sep. 27, 2018

(30) Foreign Application Priority Data

Sep. 30, 2015 (JP) .................. 2015-193047
Feb. 26, 2016 (JP) .................. 2016-035106

(51) Int. Cl.
*H01L 43/08* (2006.01)
*H01F 10/32* (2006.01)
(Continued)

(52) U.S. Cl.
CPC .......... *H01L 43/08* (2013.01); *H01F 10/325* (2013.01); *H01F 10/329* (2013.01);
(Continued)

(58) Field of Classification Search
None
See application file for complete search history.

(56) References Cited

U.S. PATENT DOCUMENTS

2007/0159270 A1* 7/2007 Sunwoo ............... H03H 9/0571
333/133

FOREIGN PATENT DOCUMENTS

WO        2011/033664 A1      3/2011
WO    WO-2011033664 A1 *      3/2011    ............... H01P 1/20

OTHER PUBLICATIONS

Tulapurkar et al., "Spin-torque diode effect in magnetic tunnel junctions," Nature, Nov. 17, 2005, vol. 438, No. 7066, pp. 339-342.

(Continued)

*Primary Examiner* — James G Norman
(74) *Attorney, Agent, or Firm* — Oliff PLC

(57) ABSTRACT

A magnetoresistive effect device including a magnetoresistive effect element with which a high-frequency filter can be realized is provided. Magnetoresistive effect device includes: at least one magnetoresistive effect element including a magnetization fixed layer, spacer layer, and magnetization free layer in which magnetization direction is changeable; first and second port; signal line; and direct-current input terminal. First and second ports are connected to each other via signal line. Magnetoresistive effect element is connected to signal line and is to be connected to ground in parallel to second port. Direct-current input terminal is connected to signal line. A closed circuit including magnetoresistive effect element, signal line, ground, and direct-current input terminal is to be formed.

9 Claims, 7 Drawing Sheets

(51) Int. Cl.
    *H01L 27/22*    (2006.01)
    *H03H 11/04*    (2006.01)
    *H03H 2/00*     (2006.01)
    *H01L 43/02*    (2006.01)
(52) U.S. Cl.
    CPC ..... *H01F 10/3254* (2013.01); *H01F 10/3295* (2013.01); *H01L 27/22* (2013.01); *H03H 2/00* (2013.01); *H03H 11/04* (2013.01); *H01L 43/02* (2013.01)

(56)　　　　　References Cited

OTHER PUBLICATIONS

Aug. 16, 2016 Written Opinion of the International Searching Authority issued in International Patent Application No. PCT/JP2016/066343.

\* cited by examiner

MAGNETORESISTIVE EFFECT DEVICE

TECHNICAL FIELD

The present invention relates to a magnetoresistive effect device including a magnetoresistive effective element.

BACKGROUND ART

With the recent enhancement of functions of mobile communication terminals including portable phones, higher-speed wireless communication is being developed. The communication speed is proportional to a frequency band that is used, and therefore, the frequency band necessary for communication expands, and the number of high-frequency filters that are necessary for and mounted in mobile communication terminals increases accordingly. As a field that is likely to be applicable to new high-frequency components, spintronics is being studied currently. One of the noticeable phenomena specific to spintronics is a spin torque resonance effect produced by a magnetoresistive effect element that includes a magnetization fixed layer, a magnetization free layer, and a spacer layer therebetween (see NPL 1). When an alternating current is supplied to a magnetoresistive effect element having such a structure, spin torque resonance can occur in the magnetoresistive effect element, and the resistance value of the magnetoresistive effect element cyclically oscillates at a frequency corresponding to the spin torque resonance frequency. The spin torque resonance frequency of the magnetoresistive effect element changes in accordance with the strength of a magnetic field applied to the magnetoresistive effect element, and the resonance frequency is usually within a high-frequency band ranging from several to several tens GHz.

CITATION LIST

Non Patent Literature

NPL 1: Nature, Vol. 438, No. 7066, pp. 339 to 342, 17 Nov. 2005

SUMMARY OF INVENTION

Technical Problem

A magnetoresistive effect element may be applicable to high-frequency devices using the spin torque resonance effect; however, a configuration for application to high-frequency filters has not been proposed. Accordingly, an object of the present invention is to provide a magnetoresistive effect device including a magnetoresistive effect element with which a high-frequency filter can be realized.

Solution to Problem

In order to achieve the above-described object, a magnetoresistive effect device according to an embodiment of the present invention includes: at least one magnetoresistive effect element including a magnetization fixed layer, a spacer layer, and a magnetization free layer in which a magnetization direction is changeable; a first port via which a high-frequency signal is input; a second port via which a high-frequency signal is output; a signal line; a direct-current input terminal; and a capacitor. The first port and the second port are connected to each other via the signal line. The magnetoresistive effect element is connected to the signal line and is to be connected to ground in parallel to the second port. The direct-current input terminal is connected to the signal line. A closed circuit including the magnetoresistive effect element, the signal line, the ground, and the direct-current input terminal is to be formed. The capacitor is connected in series to the first port and to the second port via the signal line (i) between the closed circuit and the first port; (ii) between the closed circuit and the second port; or (iii) between the closed circuit and the first port and between the closed circuit and the second port.

In the above-described magnetoresistive effect device, when a high-frequency signal is input to the magnetoresistive effect element from the first port via the signal line, spin torque resonance can be induced in the magnetoresistive effect element. With the spin torque resonance, the magnetoresistive effect element can be used as an element having a resistance value that oscillates cyclically at a frequency corresponding to the spin torque resonance frequency. With such an effect, the element impedance at frequencies close to the spin torque resonance frequency of the magnetoresistive effect element decreases. The magnetoresistive effect element is connected to the signal line and to the ground in parallel to the second port. Therefore, a high-frequency signal that is input via the first port and that has a frequency close to the spin torque resonance frequency of the magnetoresistive effect element is likely to flow into the magnetoresistive effect element and is unlikely to flow into the second port. As described above, the high-frequency signal input via the first port can be cut off and is not allowed to pass through the second port at frequencies close to the spin torque resonance frequency of the magnetoresistive effect element. That is, the above-described magnetoresistive effect device can have frequency characteristics of a high-frequency filter.

A direct current input from the direct-current input terminal flows through the closed circuit, which includes and is formed of the magnetoresistive effect element, the signal line, the ground, and the direct-current input terminal. With the closed circuit, the direct current can be efficiently supplied to the magnetoresistive effect element. When the direct current is supplied to the magnetoresistive effect element, the amount of change in the element impedance of the magnetoresistive effect element increases. Accordingly, the above-described magnetoresistive effect device can function as a high-frequency filter having a large range for the cutoff characteristics and for the passage characteristics.

The capacitor, which is connected in series to the first port and to the second port via the signal line, can stop the direct current supplied from the direct-current input terminal from flowing into the first port or into the second port. Therefore, in a case where another electronic circuit is connected to the first port or to the second port, it is possible to prevent the direct current from flowing into the other electronic circuit.

Further, the magnetoresistive effect device according to the embodiment of the present invention may further include at least one frequency setting mechanism capable of setting a spin torque resonance frequency of the magnetoresistive effect element.

The above-described magnetoresistive effect device can set the spin torque resonance frequency of the magnetoresistive effect element to a desired frequency. Accordingly, the above-described magnetoresistive effect device can function as a filter for a desired frequency band.

Further, in the magnetoresistive effect device according to the embodiment of the present invention, the frequency setting mechanism may be an effective-magnetic-field setting mechanism capable of setting an effective magnetic field in the magnetization free layer, and be capable of changing the spin torque resonance frequency of the magnetoresistive effect element by changing the effective magnetic field.

The above-described magnetoresistive effect device can variably control the spin torque resonance frequency of the magnetoresistive effect element. Accordingly, the above-described magnetoresistive effect device can function as a variable-frequency filter.

Further, in the magnetoresistive effect device according to the embodiment of the present invention, the at least one magnetoresistive effect element may include a plurality of magnetoresistive effect elements having different spin torque resonance frequencies and connected parallel to each other.

In the above-described magnetoresistive effect device, the plurality of magnetoresistive effect elements having different spin torque frequencies are connected parallel to each other. Accordingly, a cutoff frequency band having a specific width can be provided.

Further, in the magnetoresistive effect device according to the embodiment of the present invention, the at least one magnetoresistive effect element may include a plurality of magnetoresistive effect elements connected parallel to each other, and the at least one frequency setting mechanism may include a plurality of frequency setting mechanisms so as to be capable of setting respective spin torque resonance frequencies of the plurality of magnetoresistive effect elements individually.

The above-described magnetoresistive effect device includes the plurality of frequency setting mechanisms so as to be capable of setting the respective spin torque resonance frequencies of the plurality of magnetoresistive effect elements individually. Accordingly, the spin torque resonance frequencies of the respective magnetoresistive effect elements can be individually controlled. Further, the plurality of magnetoresistive effect elements are connected parallel to each other. Accordingly, a cutoff frequency band having a specific width can be provided.

Further, in the magnetoresistive effect device according to the embodiment of the present invention, the at least one magnetoresistive effect element may include a plurality of magnetoresistive effect elements having different spin torque resonance frequencies and connected in series to each other.

In the above-described magnetoresistive effect device, the plurality of magnetoresistive effect elements having different spin torque resonance frequencies are connected in series to each other. Accordingly, a cutoff frequency band having a specific width can be provided.

Further, in the magnetoresistive effect device according to the embodiment of the present invention, the at least one magnetoresistive effect element may include a plurality of magnetoresistive effect elements connected in series to each other, and the at least one frequency setting mechanism may include a plurality of frequency setting mechanisms so as to be capable of setting respective spin torque resonance frequencies of the plurality of magnetoresistive effect elements individually.

The above-described magnetoresistive effect device includes the plurality of frequency setting mechanisms so as to be capable of setting the respective spin torque resonance frequencies of the plurality of magnetoresistive effect elements individually. Accordingly, the spin torque resonance frequencies of the respective magnetoresistive effect elements can be individually controlled. Further, the plurality of magnetoresistive effect elements are connected in series to each other. Accordingly, a cutoff frequency band having a specific width can be provided.

Further, in the magnetoresistive effect device according to the embodiment of the present invention, the plurality of magnetoresistive effect elements having different spin torque resonance frequencies may have shapes for which aspect ratios differ from each other in plan view. Here, "shape in plan view" is a shape viewed from above a plane perpendicular to a direction in which the layers constituting each of the magnetoresistive effect elements are stacked. Further, "the aspect ratio of a shape in plan view" is the ratio of the length of the long sides relative to the length of the short sides of a rectangle that is circumscribed about the shape of each of the magnetoresistive effect elements with the smallest area in plan view.

In the above-described magnetoresistive effect device, the aspect ratios of the shapes of the plurality of magnetoresistive effect elements having different spin torque resonance frequencies are different from each other in plan view, and therefore, it is possible to manufacture the plurality of magnetoresistive effect elements having different spin torque resonance frequencies in the same process. That is, the film structures of the plurality of magnetoresistive effect elements can be the same, and therefore, the layers that constitute the plurality of magnetoresistive effect elements can be formed at once.

Further, in the magnetoresistive effect device according to the embodiment of the present invention, a magnetoresistive effect element connected in series to the first port and to the second port via the signal line may be not present.

In the above-described magnetoresistive effect device, a magnetoresistive effect element that is connected in series to the first port and to the second port via the signal line is not present. Therefore, degradation in the passage characteristics due to a loss caused by the magnetoresistive effect element connected in series to the first port and to the second port via the signal line can be prevented. Accordingly, the above-described magnetoresistive effect device can function as a high-frequency filter having excellent passage characteristics in the passing frequency band.

Advantageous Effects of Invention

According to the embodiment of the present invention, it is possible to provide a magnetoresistive effect device including a magnetoresistive effect element with which a high-frequency filter can be realized.

DESCRIPTION OF EMBODIMENTS

Preferred embodiments of the present invention will be described in detail with reference to the drawings. The present invention is not limited by the content described in the following embodiments. Further, constituent elements described below include those that can be easily conceived by a person skilled in the art, those that are substantially the same, and those that fall within an equivalent scope. Further, constituent elements described below can be combined as appropriate. The constituent elements can be omitted, replaced, or modified in various manners without departing from the spirit of the present invention.

(First Embodiment)

Figure 1:
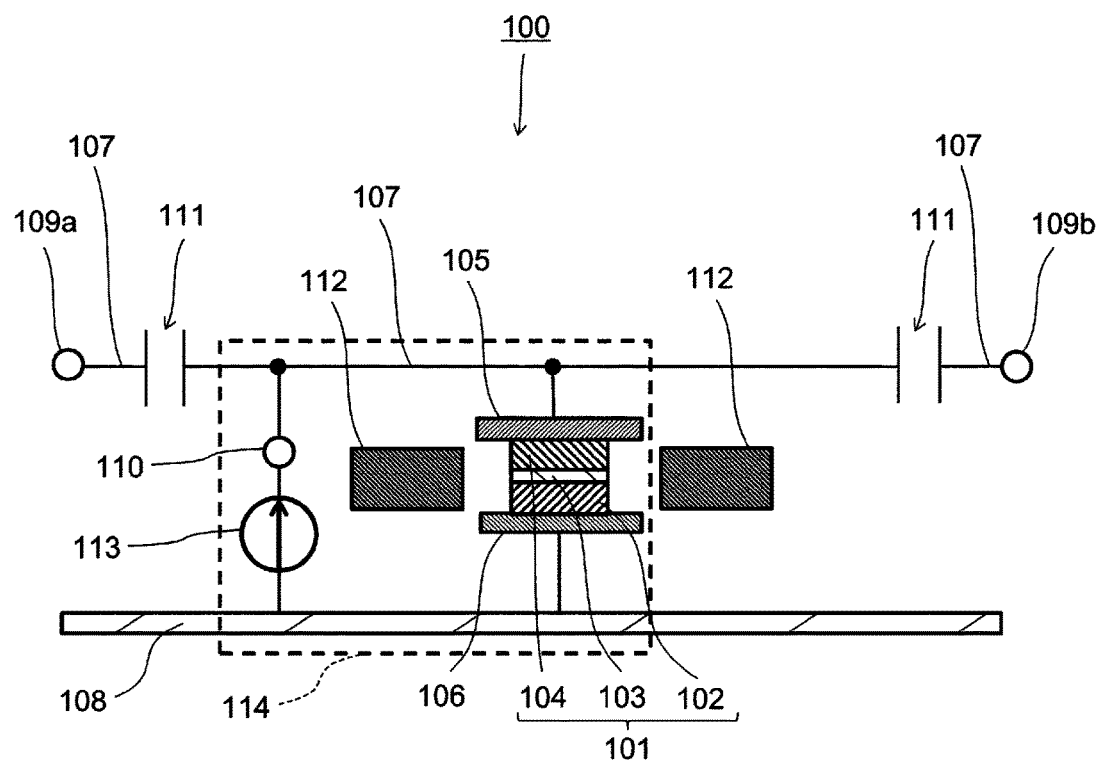
FIG. 1 is a schematic cross-sectional view illustrating a configuration of a magnetoresistive effect device according to a first embodiment.

FIG. 1 is a schematic cross-sectional view of a magnetoresistive effect device 100 according to a first embodiment of the present invention. The magnetoresistive effect device 100 includes a magnetoresistive effect element 101 including a magnetization fixed layer 102, a spacer layer 103, and a magnetization free layer 104, an upper electrode 105, a lower electrode 106, a signal line 107, a first port 109a, a second port 109b, a direct-current input terminal 110, capacitors 111, and a magnetic-field applying mechanism 112, which functions as a frequency setting mechanism. The first port 109a and the second port 109b are connected to each other via the signal line 107. The magnetoresistive effect element 101 is connected to the signal line 107 and to ground 108 in parallel to the second port 109b. The direct-current input terminal 110 is connected to the signal line 107. To the direct-current input terminal 110, a direct-current source 113, which is connected to the ground 108, is connected to thereby form a closed circuit 114, which includes the magnetoresistive effect element 101, the signal line 107, the ground 108, and the direct-current input terminal 110. The capacitors 111 are connected in series to the first port 109a and to the second port 109b via the signal line 107 between the closed circuit 114 and the first port 109a and between the closed circuit 114 and the second port 109b. In the magnetoresistive effect device 100, a magnetoresistive effect element that is connected in series to the first port 109a and to the second port 109b via the signal line 107 is not present.

The first port 109a is an input port via which a high-frequency signal, which is an alternating-current signal, is input. The second port 109b is an output port via which a high-frequency signal is output. The signal line 107 is electrically connected to the magnetoresistive effect element 101 via the upper electrode 105. Part of the high-frequency signal input via the first port 109a is input to the magnetoresistive effect element 101, and part of the high-frequency signal is output via the second port 109b. An attenuation (S21), which is the dB value of the power ratio (output power/input power) when a high-frequency signal passes from the first port 109a to the second port 109b, can be measured by using a high-frequency measuring instrument, such as a network analyzer.

The upper electrode 105 and the lower electrode 106 function as paired electrodes and are disposed in the stacking direction of the layers that constitute the magnetoresistive effect element 101 with the magnetoresistive effect element 101 therebetween. That is, the upper electrode 105 and the lower electrode 106 have a function of paired electrodes for supplying a signal (current) to the magnetoresistive effect element 101 in a direction that crosses the planes of the layers constituting the magnetoresistive effect element 101, namely, in a direction (stacking direction) perpendicular to the planes of the layers constituting the magnetoresistive effect element 101. Each of the upper electrode 105 and the lower electrode 106 is preferably formed of a film made of Ta, Cu, Au, AuCu, Ru, or two or more of these materials. The magnetoresistive effect element 101 has one end (on the side of the magnetization free layer 104), which is electrically connected to the signal line 107 via the upper electrode 105, and the other end (on the side of the magnetization fixed layer 102), which is electrically connected to the ground 108 via the lower electrode 106.

The ground 108 functions as a reference potential. The form of the signal line 107 and the ground 108 is preferably defined so as to be the microstrip line (MSL) type or the coplanar waveguide (CPW) type. When the microstrip line form or the coplanar waveguide form is designed, the signal line width of the signal line 107 and the distance to the ground are designed so that the characteristic impedance of the signal line 107 is equal to the impedance of the circuit system. As a result, the signal line 107 can be a transmission line having a small transmission loss.

The direct-current input terminal 110 is connected to the signal line 107. The direct-current source 113 is connected to the direct-current input terminal 110 to thereby enable a direct current to be supplied to the magnetoresistive effect element 101. In the magnetoresistive effect device 100 illustrated in FIG. 1, the magnetoresistive effect element 101 is arranged so that the direct current input from the direct-current input terminal 110 flows through the magnetoresistive effect element 101 in the direction from the magnetization free layer 104 to the magnetization fixed layer 102. Between the direct-current input terminal 110 and the direct-current source 113, a choke coil (inductor) or a resistance element for cutting off a high-frequency signal may be connected in series.

The direct-current source 113 is connected to the ground 108 and to the direct-current input terminal 110 and supplies a direct current to the closed circuit 114, which includes the magnetoresistive effect element 101, the signal line 107, the ground 108, and the direct-current input terminal 110, via the direct-current input terminal 110. The direct-current source 113 is constituted by, for example, a circuit that is a combination of a variable resistor and a direct-current voltage source, and is capable of changing the value of the direct current. The direct-current source 113 may be constituted by a circuit that is a combination of a fixed resistor and a direct-current voltage source capable of generating a constant direct current.

The capacitors 111 have a function of cutting off a direct current and allowing a high-frequency current to pass therethrough. The capacitors 111 may be chip capacitors or capacitors constituted by pattern lines. The capacitors 111 preferably have a capacitance of 1 μF or more. The capacitors 111 can be used to prevent the direct current from the direct-current source 113 from flowing into another electronic circuit connected to the magnetoresistive effect device 100 via the first port 109a or via the second port 109b and to efficiently supply the direct current to the magnetoresistive effect element 101. Further, the capacitors 111 can be used to protect the magnetoresistive effect element 101 from an unwanted direct current flowing from another electronic circuit.

The magnetic-field applying mechanism 112 is disposed close to the magnetoresistive effect element 101 and applies a magnetic field to the magnetoresistive effect element 101 to thereby enable the spin torque resonance frequency of the magnetoresistive effect element 101 to be set. The magnetic-field applying mechanism 112 is, for example, an electromagnetic mechanism or a strip-line mechanism capable of variably controlling the strength of the magnetic field to be applied by using the voltage or the current. Alternatively, the magnetic-field applying mechanism 112 may be constituted by a combination of an electromagnetic mechanism or a strip-line mechanism and a permanent magnet that applies only a constant magnetic field. The magnetic-field applying mechanism 112 changes the magnetic field to be applied to the magnetoresistive effect element 101 to change an effective magnetic field in the magnetization free layer 104, thereby enabling the spin torque resonance frequency of the magnetoresistive effect element 101 to be changed.

The magnetization fixed layer 102 is made of a ferromagnetic material and has a magnetization direction substantially fixed in one direction. The magnetization fixed layer 102 is preferably made of a material having high spin polarizability, such as Fe, Co, Ni, an alloy of Ni and Fe, an alloy of Fe and Co, or an alloy of Fe, Co, and B. This can achieve a high magnetoresistance change ratio. Alternatively, the magnetization fixed layer 102 may be made of a Heusler alloy. The film thickness of the magnetization fixed layer 102 is preferably set to 1 to 10 nm. In order to fix magnetization of the magnetization fixed layer 102, an antiferromagnetic layer may be added so as to be in contact with the magnetization fixed layer 102. Alternatively, magnetization of the magnetization fixed layer 102 may be fixed by using magnetic anisotropy caused by, for example, the crystal structure or form. For the antiferromagnetic layer, for example, FeO, CoO, NiO, $CuFeS_2$, IrMn, FeMn, PtMn, Cr, or Mn can be used.

The spacer layer 103 is arranged between the magnetization fixed layer 102 and the magnetization free layer 104. Magnetization of the magnetization fixed layer 102 and magnetization of the magnetization free layer 104 interact with each other to produce a magnetoresistance effect. The spacer layer 103 is formed of a layer constituted by an electric conductor, an insulator, or a semiconductor or a layer that includes a current-carrying point formed of a conductor in an insulator.

In a case of using a nonmagnetic and electrically conductive material for the spacer layer 103, the material may be, for example, Cu, Ag, Au, or Ru, and a giant magnetoresistance (GMR) effect is produced in the magnetoresistive effect element 101. In a case of using the GMR effect, the film thickness of the spacer layer 103 is preferably set to about 0.5 to 3.0 nm.

In a case of using a nonmagnetic insulating material for the spacer layer 103, the material may be, for example, $Al_2O_3$ or MgO, and a tunnel magnetoresistance (TMR) effect is produced in the magnetoresistive effect element 1a. The film thickness of the spacer layer 103 is adjusted so as to produce a coherent tunnel effect between the magnetization fixed layer 102 and the magnetization free layer 104, thereby achieving a high magnetoresistance change ratio. In a case of using the TMR effect, the film thickness of the spacer layer 103 is preferably set to about 0.5 to 3.0 nm.

In a case of using a nonmagnetic semiconductor material for the spacer layer 103, the material may be, for example, ZnO, $In_2O_3$, $SnO_2$, ITO, $GaO_x$, or $Ga_2O_x$. The film thickness of the spacer layer 103 is preferably set to about 1.0 to 4.0 nm.

In a case of using a layer that includes a current-carrying point formed of a conductor in a nonmagnetic insulator for the spacer layer 103, the layer preferably has a structure that includes a current-carrying point formed of a conductor, such as CoFe, CoFeB, CoFeSi, CoMnGe, CoMnSi, CoMnAl, Fe, Co, Au, Cu, Al, or Mg, in a nonmagnetic insulator made of $Al_2O_3$ or MgO. In this case, the film thickness of the spacer layer 103 is preferably set to about 0.5 to 2.0 nm.

The direction of magnetization of the magnetization free layer 104 can be changed by an externally applied magnetic field or spin-polarized electrons, and the magnetization free layer 104 is made of a ferromagnetic material. In a case where the magnetization free layer 104 is made of a material having the easy magnetization axis in the film in-plane direction, the material may be, for example, CoFe, CoFeB, CoFeSi, CoMnGe, CoMnSi, or CoMnAl. The thickness of the magnetization free layer 104 is preferably set to about 1 to 10 nm. In a case where the magnetization free layer 104 is made of a material having the easy magnetization axis in a direction normal to the film plane, the material may be, for example, Co, a CoCr-based alloy, a Co multilayer film, a CoCrPt-based alloy, a FePt-based alloy, a SmCo-based alloy that includes a rare earth element, or a TbFeCo alloy. Alternatively, the magnetization free layer 104 may be made of a Heusler alloy. Between the magnetization free layer 104 and the spacer layer 103, a material having high spin polarizability may be interposed. This can achieve a high magnetoresistance change ratio. The material having high spin polarizability may be, for example, a CoFe alloy or a CoFeB alloy. The film thickness of the CoFe alloy and that of the CoFeB alloy are preferably set to about 0.2 to 1.0 nm.

Between the upper electrode 105 and the magnetoresistive effect element 101 and between the lower electrode 106 and the magnetoresistive effect element 101, a cap layer, a seed layer, or a buffer layer may be disposed. The cap layer, the seed layer, or the buffer layer may be made of Ru, Ta, Cu, Cr or a film formed by staking these materials. The film thicknesses of these layers are preferably set to about 2 to 10 nm.

It is desirable to set the size of the magnetoresistive effect element 101 such that, in a case where the magnetoresistive effect element 101 has a rectangular shape (including a square shape) in plan view, the long sides are set to about 100 nm or less. In a case where the magnetoresistive effect element 101 does not have a rectangular shape in plan view, the long sides of a rectangle that is circumscribed about the shape of the magnetoresistive effect element 101 with the smallest area in plan view are defined as the long sides of the magnetoresistive effect element 101. In a case where the long sides are short and about 100 nm, the magnetic domains of the magnetization free layer 104 can become a single magnetic domain, and a spin torque resonance phenomenon can occur with high sensitivity. Here, "shape in plan view" is a shape viewed from above a plane perpendicular to a direction in which the layers constituting the magnetoresistive effect element are stacked.

Now, a spin torque resonance phenomenon is described.

When a high-frequency signal having a frequency identical to a spin torque resonance frequency specific to the magnetoresistive effect element 101 is input to the magnetoresistive effect element 101, magnetization of the magnetization free layer 104 oscillates at the spin torque resonance frequency. This phenomenon is called a spin torque resonance phenomenon. The element resistance value of the magnetoresistive effect element 101 is determined in accordance with the relative angle between magnetization of the magnetization fixed layer 102 and that of the magnetization free layer 104. Therefore, the resistance value of the magnetoresistive effect element 101 while spin torque resonance occurs changes cyclically in association with oscillation of magnetization of the magnetization free layer 104. That is, the magnetoresistive effect element 101 can be used as a resistive oscillating element having a resistance value that changes cyclically at the spin torque resonance frequency. Further, when a high-frequency signal having a frequency identical to the spin torque resonance frequency is input to the resistive oscillating element, the phases synchronize with each other, and the impedance for the high-frequency signal decreases. That is, the magnetoresistive effect element 101 can be used as a resistive element with which the impedance of the high-frequency signal decreases at the spin torque resonance frequency due to the spin torque resonance phenomenon.

The spin torque resonance frequency changes in accordance with an effective magnetic field in the magnetization free layer 104. The effective magnetic field $H_{eff}$ in the magnetization free layer 104 is expressed by $$H_{eff}=H_E+H_k+H_D+H_{EX},$$

where $H_E$ represents an external magnetic field applied to the magnetization free layer, $H_k$ represents an anisotropic magnetic field in the magnetization free layer 104, $H_D$ represents a demagnetizing field in the magnetization free layer 104, and $H_{EX}$ represents an exchange coupling magnetic field in the magnetization free layer 104. The magnetic-field applying mechanism 112 is an effective-magnetic-field setting mechanism that applies a magnetic field to the magnetoresistive effect element 101 to apply the external magnetic field $H_E$ to the magnetization free layer 104, thereby enabling the effective magnetic field $H_{eff}$ in the magnetization free layer 104 to be set. The magnetic-field applying mechanism 112, which is an effective-magnetic-field setting mechanism, changes the magnetic field to be applied to the magnetoresistive effect element 101 to thereby change the effective magnetic field in the magnetization free layer 104 and enable the spin torque resonance frequency of the magnetoresistive effect element 101 to be changed. As described above, when the magnetic field to be applied to the magnetoresistive effect element 101 is changed, the spin torque resonance frequency changes.

When a direct current is supplied to the magnetoresistive effect element 101 while spin torque resonance occurs, the spin torque increases, and the amplitude of the oscillating resistance value increases. When the amplitude of the oscillating resistance value increases, the amount of change in the element impedance of the magnetoresistive effect element 101 increases. When the current density of the direct current to be supplied is changed, the spin torque resonance frequency changes. Therefore, the spin torque resonance frequency of the magnetoresistive effect element 101 can be changed by changing the magnetic field to be applied by the magnetic-field applying mechanism 112 or changing the direct current to be supplied from the direct-current input terminal 110. The current density of the direct current to be supplied to the magnetoresistive effect element 101 is preferably smaller than the oscillation threshold current density of the magnetoresistive effect element 101. The oscillation threshold current density of the magnetoresistive effect element is a threshold of the current density such that, if a direct current having a current density equal to or higher than the threshold is supplied, precession starts at a constant frequency and at a constant amplitude in magnetization of the magnetization free layer of the magnetoresistive effect element and the magnetoresistive effect element oscillates (the output (resistance value) of the magnetoresistive effect element fluctuates at a constant frequency and at a constant amplitude).

Part of the high-frequency signal input via the first port 109a passes through the magnetoresistive effect element 101 and flows into the ground 108, and the remaining high-frequency signal is output via the second port 109b. At this time, due to the spin torque resonance phenomenon, among the high-frequency components of the high-frequency signal input via the first port 109a, frequency components that match the spin torque resonance frequency of the magnetoresistive effect element 101 or that are close to the spin torque resonance frequency are likely to flow into the magnetoresistive effect element 101 in a low-impedance state and are unlikely to be output via the second port 109b. As described above, the magnetoresistive effect device 100 can have a function of a high-frequency filter in which frequencies close to the spin torque resonance frequency correspond to the cutoff frequency band. That is, the magnetoresistive effect device 100 functions as a band-cutoff-type filter (band elimination filter). Here, at a frequency that matches the spin torque resonance frequency of the magnetoresistive effect element 101 or at frequencies close to the spin torque resonance frequency (frequencies in the cutoff frequency band), it is desirable that the impedance of the magnetoresistive effect element 101 be smaller than the impedance of another electronic circuit that is connected to the second port 109b. At frequencies other than the spin torque resonance frequency or at frequencies other than the frequencies close to the spin torque resonance frequency (that is, frequencies in the passing frequency band), it is desirable that the impedance of the magnetoresistive effect element 101 be larger than the impedance of another electronic circuit that is connected to the second port 109b.

Figure 2:
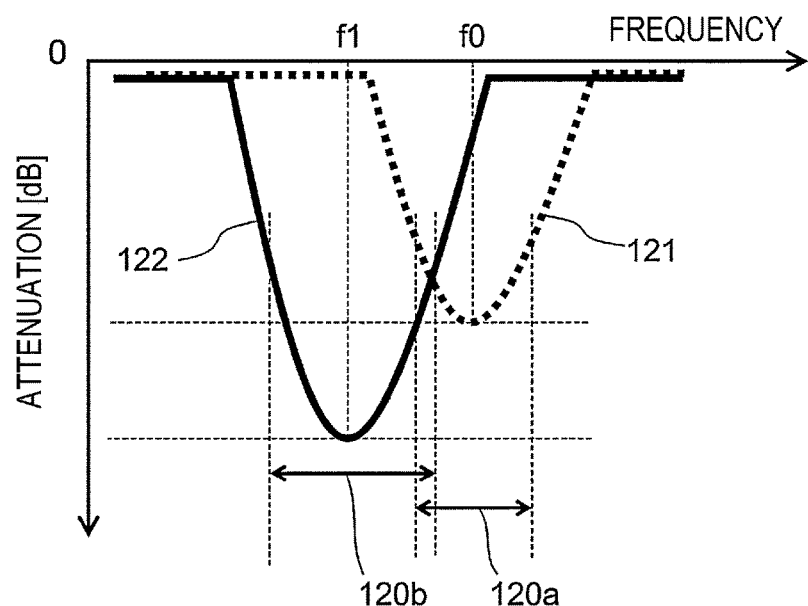
FIG. 2 is a graph illustrating a relationship between a frequency and an attenuation in the magnetoresistive effect device according to the first embodiment.
Figure 3:
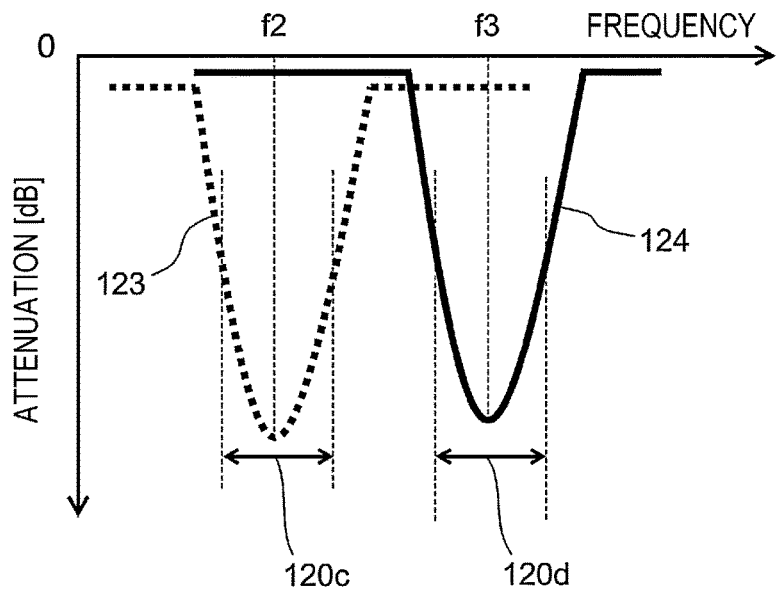
FIG. 3 is a graph illustrating a relationship between a frequency and an attenuation in the magnetoresistive effect device according to the first embodiment.

FIG. 2 and FIG. 3 are graphs illustrating a relationship between the frequency of the high-frequency signal input to the magnetoresistive effect device 100 and the attenuation. In FIG. 2 and FIG. 3, the vertical axis represents the attenuation, and the horizontal axis represents the frequency. FIG. 2 is a graph when the magnetic field applied to the magnetoresistive effect element 101 is constant. In FIG. 2, the plot line 121 represents a case where the value of the direct current supplied to the magnetoresistive effect element 101 from the direct-current input terminal 110 is equal to I0, and the plot line 122 represents a case where the value of the direct current supplied to the magnetoresistive effect element 101 from the direct-current input terminal 110 is equal to I1 (>I0). FIG. 3 is a graph when the direct current supplied to the magnetoresistive effect element 101 is constant. In FIG. 3, the plot line 123 represents a case where the strength of the magnetic field applied from the magnetic-field applying mechanism 112 is equal to H0, and the plot line 124 represents a case where the strength of the magnetic field applied from the magnetic-field applying mechanism 112 is equal to H1 (>H0). As illustrated in FIG. 2, for example, in a case where the value of the direct current supplied to the magnetoresistive effect element 101 from the direct-current input terminal 110 is increased from I0 to I1, the amount of decrease in the element impedance at frequencies close to the spin torque resonance frequency of the magnetoresistive effect element 101 (frequencies in the cutoff frequency band) increases in association with the change in the value of the direct current. Accordingly, the high-frequency signal that is output via the second port 109b further decreases, and the attenuation (the absolute value of the attenuation) increases. As a result, the magnetoresistive effect device 100 can be used to realize a high-frequency filter having a large range for the cutoff characteristics and for the passage characteristics. Further, as the value of the direct current increases, the spin torque resonance frequency of the magnetoresistive effect element 101 shifts from the frequency f0 to the frequency f1, namely, to a lower frequency, and the cutoff frequency band shifts from the frequency band 120a to the frequency band 120b, namely, to lower frequencies. That is, the magnetoresistive effect device 100 can also function as a high-frequency filter capable of changing frequencies in the cutoff frequency band.

Further, as illustrated in FIG. 3, for example, in a case where the strength of the magnetic field applied from the magnetic-field applying mechanism 112 is increased from H0 to H1, the spin torque resonance frequency of the magnetoresistive effect element 101 shifts from the frequency f2 to the frequency f3, namely, to a higher frequency, and the cutoff frequency band shifts from the frequency band 120c to the frequency band 120d, namely, to higher frequencies. The cutoff frequency band can be shifted by a larger amount in the case of changing the strength of the magnetic field (the effective magnetic field $H_{eff}$ in the magnetization free layer 104) than in the case of changing the value of the direct current. That is, the magnetoresistive effect device 100 can function as a high-frequency filter capable of changing frequencies in the cutoff frequency band.

Note that, as the external magnetic field $H_E$ applied to the magnetoresistive effect element 101 (the effective magnetic field $H_{eff}$ in the magnetization free layer 104) becomes larger, the amplitude of the oscillating resistance value of the magnetoresistive effect element 101 decreases. Therefore, the current density of the direct current to be supplied to the magnetoresistive effect element 101 is preferably increased as the external magnetic field $H_E$ applied to the magnetoresistive effect element 101 (the effective magnetic field $H_{eff}$ in the magnetization free layer 104) becomes larger.

As described above, the magnetoresistive effect device 100 includes the magnetoresistive effect element 101 including the magnetization fixed layer 102, the spacer layer 103, and the magnetization free layer 104 in which the direction of magnetization is changeable, the first port 109a, the second port 109b, the signal line 107, the direct-current input terminal 110, and the capacitors 111. The first port 109a and the second port 109b are connected to each other via the signal line 107. The magnetoresistive effect element 101 is connected to the signal line 107 and to the ground 108 in parallel to the second port 109b. The direct-current input terminal 110 is connected to the signal line 107. The closed circuit 114 including the magnetoresistive effect element 101, the signal line 107, the ground 108, and the direct-current input terminal 110 is formed. The capacitors 111 are connected in series to the first port 109a and to the second port 109b via the signal line 107 between the closed circuit 114 and the first port 109a and between the closed circuit 114 and the second port 109b.

Accordingly, when a high-frequency signal is input to the magnetoresistive effect element 101 from the first port 109a via the signal line 107, spin torque resonance can be induced in the magnetoresistive effect element 101. With the spin torque resonance, the magnetoresistive effect element 101 can be used as an element having a resistance value that cyclically oscillates at a frequency corresponding to the spin torque resonance frequency. With such an effect, the element impedance at frequencies close to the spin torque resonance frequency of the magnetoresistive effect element 101 decreases. The magnetoresistive effect element 101 is connected to the signal line 107 and to the ground 108 in parallel to the second port 109b. Therefore, a high-frequency signal that is input via the first port 109a and that has a frequency close to the spin torque resonance frequency of the magnetoresistive effect element 101 is likely to flow into the magnetoresistive effect element 101 and is unlikely to flow into the second port 109b. As described above, a high-frequency signal input via the first port 109a can be cut off and is not allowed to pass through the second port 109b at frequencies close to the spin torque resonance frequency of the magnetoresistive effect element 101. That is, the magnetoresistive effect device 100 can have frequency characteristics of a high-frequency filter.

The direct current input from the direct-current input terminal 110 flows through the closed circuit 114, which includes and is formed of the magnetoresistive effect element 101, the signal line 107, the ground 108, and the direct-current input terminal 110. With the closed circuit 114, the direct current can be efficiently supplied to the magnetoresistive effect element 101. When the direct current is supplied to the magnetoresistive effect element 101, the spin torque increases, and the amplitude of the oscillating resistance value increases. When the amplitude of the oscillating resistance value increases, the amount of change in the element impedance of the magnetoresistive effect element 101 increases. Accordingly, the magnetoresistive effect device 100 can function as a high-frequency filter having a large range for the cutoff characteristics and for the passage characteristics.

In order to increase the range of the cutoff characteristics and the range of the passage characteristics, the magnetization free layer 104 preferably has a structure that includes the easy magnetization axis in a direction normal to the film plane, and the magnetization fixed layer 102 preferably has a structure that includes the easy magnetization axis in the film plane direction.

The capacitors 111, which are connected in series to the first port 109a and to the second port 109b via the signal line 107, can stop the direct current supplied from the direct-current input terminal 110 from flowing into the first port 109a or into the second port 109b. Therefore, in a case where another electronic circuit is connected to the first port 109a or to the second port 109b, it is possible to prevent the direct current from flowing into the other electronic circuit.

Further, the direct current supplied from the direct-current input terminal 110 is changed to thereby enable the spin torque resonance frequency of the magnetoresistive effect element 101 to be variably controlled. Accordingly, the magnetoresistive effect device 100 can also function as a variable-frequency filter.

Further, the magnetoresistive effect device 100 includes the magnetic-field applying mechanism 112, which functions as a frequency setting mechanism capable of setting the spin torque resonance frequency of the magnetoresistive effect element 101, and therefore, can set the spin torque resonance frequency of the magnetoresistive effect element 101 to a desired frequency. Accordingly, the magnetoresistive effect device 100 can function as a filter for a desired frequency band.

Further, the magnetoresistive effect device 100 includes the magnetic-field applying mechanism 112, which is an effective-magnetic-field setting mechanism capable of setting the effective magnetic field in the magnetization free layer 104, and changes the effective magnetic field in the magnetization free layer 104 to thereby enable the spin torque resonance frequency of the magnetoresistive effect element 101 to be changed. Accordingly, the magnetoresistive effect device 100 can function as a variable-frequency filter.

Further, in the magnetoresistive effect device 100, a magnetoresistive effect element that is connected in series to the first port 109a and to the second port 109b via the signal line 107 is not present. Therefore, degradation in the passage characteristics due to a loss caused by the magnetoresistive effect element connected in series to the first port 109a and to the second port 109b via the signal line 107 can be prevented. Accordingly, the magnetoresistive effect device 100 can function as a high-frequency filter having excellent passage characteristics in the passing frequency band.

Further, the description has been given in the first embodiment under the example assumption that the capacitors 111 are provided such that one of the capacitors 111 is connected between the closed circuit 114 and the first port 109a and the other is connected between the closed circuit 114 and the second port 109b; however, a form may be employed in which one capacitor 111 is connected between the closed circuit 114 and the first port 109a or between the closed circuit 114 and the second port 109b. Also in this case, it is possible to stop the direct current supplied from the direct-current input terminal 110 from flowing into the first port 109a or into the second port 109b. Further, the description has been given in the first embodiment under the example assumption that one capacitor 111 is connected between the closed circuit 114 and the first port 109a and one capacitor 111 is connected between the closed circuit 114 and the second port 109b; however, a plurality of capacitors 111 may be connected between the closed circuit 114 and the first port 109a, and a plurality of capacitors 111 may be connected between the closed circuit 114 and the second port 109b.

(Second Embodiment)

Figure 4:
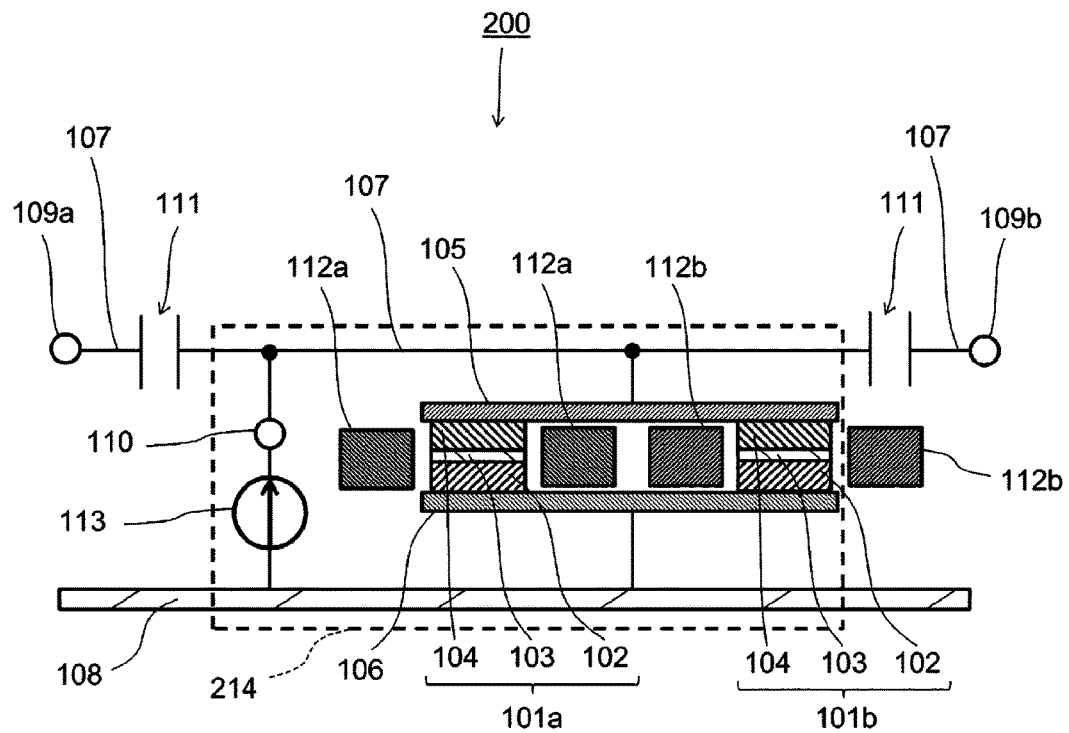
FIG. 4 is a schematic cross-sectional view illustrating a configuration of a magnetoresistive effect device according to a second embodiment.

FIG. 4 is a schematic cross-sectional view of a magnetoresistive effect device 200 according to a second embodiment of the present invention. Regarding the magnetoresistive effect device 200, differences from the magnetoresistive effect device 100 according to the first embodiment are mainly described, and description of common matters is omitted as appropriate. Any element used in common with the magnetoresistive effect device 100 according to the first embodiment is assigned the same reference numeral, and description thereof is omitted. The magnetoresistive effect device 200 includes two magnetoresistive effect elements 101a and 101b each including the magnetization fixed layer 102, the spacer layer 103, and the magnetization free layer 104, the upper electrode 105, the lower electrode 106, the signal line 107, the first port 109a, the second port 109b, the direct-current input terminal 110, the capacitors 111, and magnetic-field applying mechanisms 112a and 112b, which function as two frequency setting mechanisms. The two magnetoresistive effect elements 101a and 101b have the same structures and are connected parallel to each other between the upper electrode 105 and the lower electrode 106. The magnetic-field applying mechanisms 112a and 112b each have the same structure as that of the magnetic-field applying mechanism 112 according to the first embodiment. The magnetic-field applying mechanism 112a applies a magnetic field to the magnetoresistive effect element 101a, and the magnetic-field applying mechanism 112b applies a magnetic field to the magnetoresistive effect element 101b.

As described above, the magnetoresistive effect device 200 includes the magnetic-field applying mechanisms 112a and 112b, which function as frequency setting mechanisms, so as to be capable of setting the spin torque resonance frequency of each of the magnetoresistive effect elements 101a and 101b individually. The first port 109a and the second port 109b are connected to each other via the signal line 107, and the two magnetoresistive effect elements 101a and 101b are connected to the signal line 107 and to the ground 108 in parallel to the second port 109b. The direct-current terminal 110 is connected to the signal line 107, and the direct-current source 113 connected to the ground 108 is connected to the direct-current input terminal 110 to thereby form a closed circuit 214, which includes the magnetoresistive effect element 101a, the magnetoresistive effect element 101b, the signal line 107, the ground 108, and the direct-current input terminal 110. The direct current input from the direct-current input terminal 110 flows through the closed circuit 214 and is supplied to the magnetoresistive effect element 101a and to the magnetoresistive effect element 101b. The capacitors 111 are connected in series to the first port 109a and to the second port 109b via the signal line 107 between the closed circuit 214 and the first port 109a and between the closed circuit 214 and the second port 109b.

Part of the high-frequency signal input via the first port 109a passes through the magnetoresistive effect element 101a and the magnetoresistive effect element 101b connected in parallel and flows into the ground 108, and the remaining high-frequency signal is output via the second port 109b. At this time, due to the spin torque resonance phenomenon, among the high-frequency components of the high-frequency signal input via the first port 109a, frequency components that match the spin torque resonance frequency of the magnetoresistive effect element 101a or the magnetoresistive effect element 101b or that are close to the spin torque resonance frequency of the magnetoresistive effect element 101a or the magnetoresistive effect element 101b are likely to flow into the magnetoresistive effect element 101a or the magnetoresistive effect element 101b connected in parallel and having a combined impedance that is in a low-impedance state and are unlikely to be output via the second port 109b. That is, the magnetoresistive effect device 200 can have a function of a high-frequency filter in which frequencies close to the spin torque resonance frequency of the magnetoresistive effect element 101a or the magnetoresistive effect element 101b correspond to the cutoff frequency band.

Figure 5:
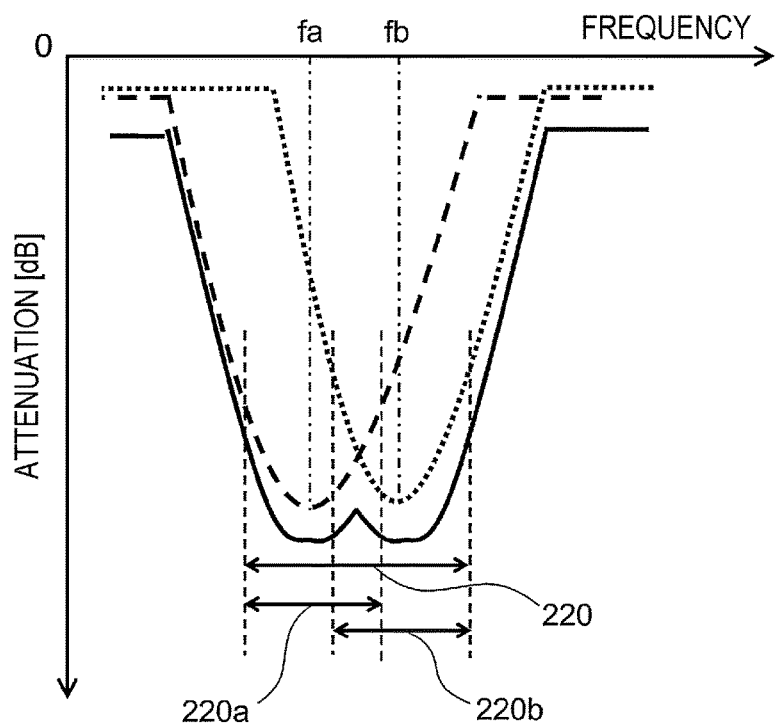
FIG. 5 is a graph illustrating a relationship between a frequency and an attenuation in the magnetoresistive effect device according to the second embodiment.

FIG. 5 is a graph illustrating a relationship between the frequency of the high-frequency signal input to the magnetoresistive effect device 200 and the attenuation. In FIG. 5, the vertical axis represents the attenuation, and the horizontal axis represents the frequency. As illustrated in FIG. 5, for example, the spin torque resonance frequency of the magnetoresistive effect element 101a is represented by fa, and the spin torque resonance frequency of the magnetoresistive effect element 101b is represented by fb. Then, in a case where the strength of the magnetic field applied to the magnetoresistive effect element 101b is higher than the strength of the magnetic field applied to the magnetoresistive effect element 101a, fa<fb is satisfied. Here, the two magnetoresistive effect elements 101a and 101b are connected parallel to each other. Therefore, when at least one of the magnetoresistive effect element 101a and the magnetoresistive effect element 101b enters a low-impedance state due to the spin torque resonance phenomenon, the combined impedance of the magnetoresistive effect element 101a and the magnetoresistive effect element 101b connected in parallel becomes lower than that in a case where spin torque resonance does not occur in the magnetoresistive effect element 101a or 101b. Accordingly, the high-frequency signal input via the first port 109a is unlikely to be output via the second port 109b. Therefore, as illustrated in FIG. 5, when the strengths of the magnetic fields applied to the magnetoresistive effect elements 101a and 101b by the magnetic-field applying mechanisms 112a and 112b are adjusted so that some frequencies (part of the cutoff frequency band 220a illustrated in FIG. 5) close to the spin torque resonance frequency fa of the magnetoresistive effect element 101a and some frequencies (part of the cutoff frequency band 220b illustrated in FIG. 5) close to the spin torque resonance frequency fb of the magnetoresistive effect element 101b overlap, the magnetoresistive effect device 200 can have a cutoff frequency band (the cutoff frequency band 220 illustrated in FIG. 5) wider than that of the magnetoresistive effect device 100 according to the first embodiment, as illustrated in FIG. 5. Further, when the direct current supplied to the magnetoresistive effect elements 101a and 101b is changed or the magnetic fields applied to the magnetoresistive effect elements 101a and 101b by the magnetic-field applying mechanisms 112a and 112b are changed, the band can be changed as desired. Accordingly, the magnetoresistive effect device 200 can function as a variable-frequency filter capable of changing the cutoff frequency band as desired.

As described above, the magnetoresistive effect device 200 includes the magnetic-field applying mechanisms 112a and 112b, which function as frequency setting mechanisms, so as to be capable of setting the spin torque resonance frequency of each of the magnetoresistive effect elements 101a and 101b individually. Therefore, the magnetoresistive effect device 200 can control the spin torque resonance frequencies of the respective magnetoresistive effect elements individually. Further, the magnetoresistive effect elements 101a and 101b are connected parallel to each other, and therefore, the combined impedance of the plurality of magnetoresistive effect elements 101a and 101b connected in parallel can be decreased at frequencies close to a plurality of frequencies identical to the spin torque resonance frequencies of the respective magnetoresistive effect elements. Accordingly, the cutoff frequency band 220 having a specific width can be provided. Further, when the direct current supplied to the magnetoresistive effect elements 101a and 101b is changed or the magnetic fields applied to the magnetoresistive effect elements 101a and 101b by the magnetic-field applying mechanisms 112a and 112b are changed, the band can be changed as desired. Accordingly, the magnetoresistive effect device 200 can function as a variable-frequency filter having a cutoff frequency band with a specific width and capable of changing the passing frequency band as desired.

The magnetoresistive effect device 200 according to the second embodiment includes the two magnetoresistive effect elements 101a and 101b connected parallel to each other and the two frequency setting mechanisms (magnetic-field applying mechanisms 112a and 112b) so as to be capable of setting the spin torque resonance frequencies of the respective magnetoresistive effect elements individually. Alternatively, the magnetoresistive effect device 200 may include three or more magnetoresistive effect elements connected parallel to one another and three or more frequency setting mechanisms (magnetic-field applying mechanisms) so as to be capable of setting the spin torque resonance frequencies of the respective magnetoresistive effect elements individually. In this case, the width of the cutoff frequency band can be further increased.

Further, in the magnetoresistive effect device 200 according to the second embodiment, the two magnetoresistive effect elements 101a and 101b have the same structures; however, the plurality of magnetoresistive effect elements may have different structures.

(Third Embodiment)

Figure 6:
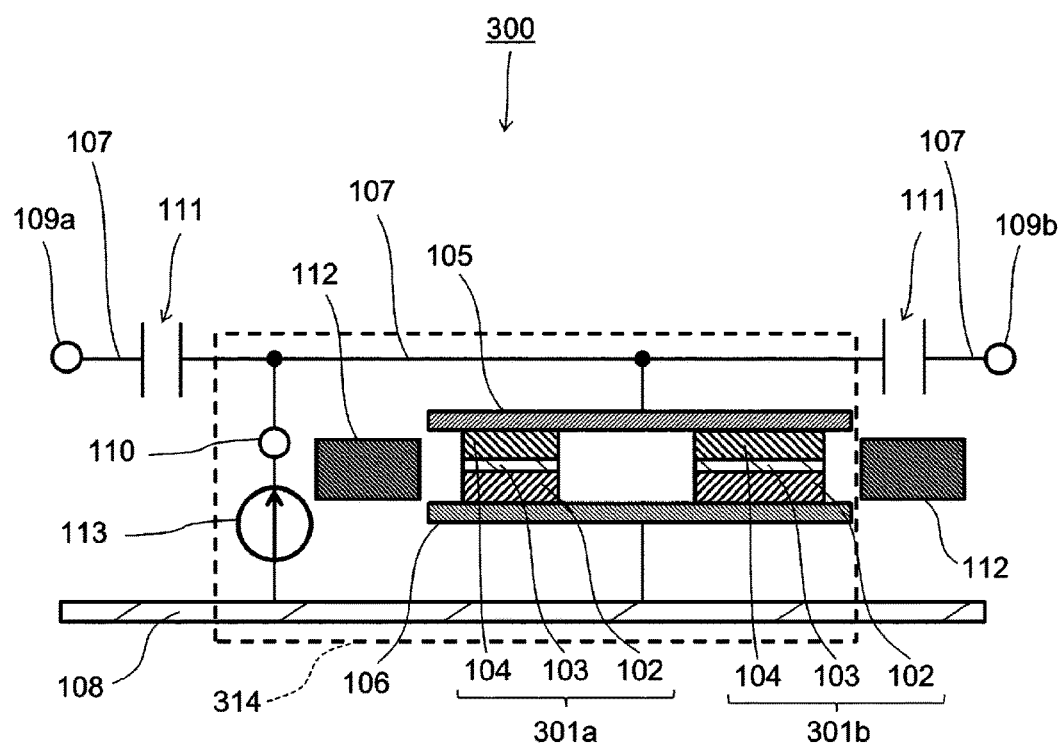
FIG. 6 is a schematic cross-sectional view illustrating a configuration of a magnetoresistive effect device according to a third embodiment.

FIG. 6 is a schematic cross-sectional view of a magnetoresistive effect device 300 according to a third embodiment of the present invention. Regarding the magnetoresistive effect device 300, differences from the magnetoresistive effect device 100 according to the first embodiment are mainly described, and description of common matters is omitted as appropriate. Any element used in common with the magnetoresistive effect device 100 according to the first embodiment is assigned the same reference numeral, and description thereof is omitted. The magnetoresistive effect device 300 includes two magnetoresistive effect elements 301a and 301b each including the magnetization fixed layer 102, the spacer layer 103, and the magnetization free layer 104, the upper electrode 105, the lower electrode 106, the signal line 107, the first port 109a, the second port 109b, the direct-current input terminal 110, the capacitors 111, and the magnetic-field applying mechanism 112, which functions as a frequency setting mechanism. The magnetoresistive effect elements 301a and 301b are connected parallel to each other between the upper electrode 105 and the lower electrode 106. The magnetoresistive effect elements 301a and 301b have different spin torque resonance frequencies in a state where the same magnetic field is applied and a direct current having the same current density is supplied. More specifically, the magnetoresistive effect elements 301a and 301b have the same film structures and have rectangular shapes in plan view; however, the aspect ratios of the shapes in plan view are different from each other. Here, "the same film structure" means that the material and film thickness of each layer constituting each of the magnetoresistive effect elements are the same and the order in which the respective layers are stacked is the same in the magnetoresistive effect elements. Further, "shape in plan view" is a shape viewed from above a plane perpendicular to a direction in which the layers constituting each of the magnetoresistive effect elements are stacked. Further, "the aspect ratio of a shape in plan view" is the ratio of the length of the long sides relative to the length of the short sides of a rectangle that is circumscribed about the shape of each of the magnetoresistive effect elements with the smallest area in plan view.

The first port 109a and the second port 109b are connected to each other via the signal line 107, and the magnetoresistive effect element 301a and the magnetoresistive effect element 301b are connected to the signal line 107 and to the ground 108 in parallel to the second port 109b. The direct-current input terminal 110 is connected to the signal line 107, and the direct-current source 113 connected to the ground 108 is connected to the direct-current input terminal 110 to thereby form a closed circuit 314, which includes the magnetoresistive effect element 301a, the magnetoresistive effect element 301b, the signal line 107, the ground 108, and the direct-current input terminal 110. The direct current input from the direct-current input terminal 110 flows through the closed circuit 314 and is supplied to the magnetoresistive effect element 301a and to the magnetoresistive effect element 301b. The capacitors 111 are connected in series to the first port 109a and to the second port 109b via the signal line 107 between the closed circuit 314 and the first port 109a and between the closed circuit 314 and the second port 109b.

The magnetic-field applying mechanism 112 is disposed close to the magnetoresistive effect elements 301a and 301b and applies the same magnetic field to the magnetoresistive effect elements 301a and 301b simultaneously. The magnetic-field applying mechanism 112 changes the magnetic field to be applied to the magnetoresistive effect elements 301a and 301b to thereby change the effective magnetic field in the magnetization free layer 104 in each of the magnetoresistive effect elements 301a and 301b and enable the spin torque resonance frequency of each of the magnetoresistive effect elements 301a and 301b to be changed.

Figure 7:
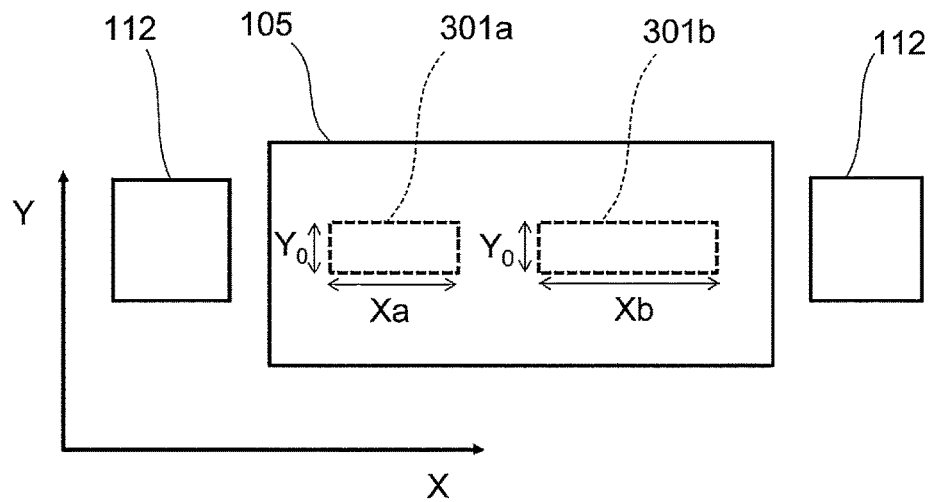
FIG. 7 is a top view of the magnetoresistive effect device according to the third embodiment.

The film structures of the magnetoresistive effect elements 301a and 301b are the same as that of the magnetoresistive effect element 101 according to the first embodiment. FIG. 7 is a top view of the magnetoresistive effect device 300. As illustrated in FIG. 7, the lengths of the short sides of the shapes of the magnetoresistive effect elements 301a and 301b in plan view in the Y direction are the same and equal to $Y_0$; however, the length Xa of the long sides of the shape of the magnetoresistive effect element 301a in plan view in the X direction is different from the length Xb of the long sides of the shape of the magnetoresistive effect element 301b in plan view in the X direction, and Xa<Xb is satisfied. Therefore, the aspect ratio (Xb/$Y_0$) of the shape of the magnetoresistive effect element 301b in plan view is larger than the aspect ratio (Xa/$Y_0$) of the shape of the magnetoresistive effect element 301a in plan view. A state where the same magnetic field is applied and a direct current having the same current density is supplied to a magnetoresistive effect element is assumed. Then, as the aspect ratio of the shape of the magnetoresistive effect element in plan view increases, the spin torque resonance frequency of the magnetoresistive effect element increases. Therefore, the spin torque resonance frequency fb of the magnetoresistive effect element 301b is higher than the spin torque resonance frequency fa of the magnetoresistive effect element 301a. As described above, when the aspect ratios of the shapes of a plurality of magnetoresistive effect elements in plan view are made different from each other, the spin torque resonance frequencies can be made different from each other even if the film structures are the same. Accordingly, it is possible to manufacture a plurality of magnetoresistive effect elements having different spin torque resonance frequencies in the same film forming process. That is, the film structures of the plurality of magnetoresistive effect elements can be the same, and therefore, the layers that constitute the plurality of magnetoresistive effect elements can be formed at once.

Part of the high-frequency signal input via the first port 109a passes through the magnetoresistive effect element 301a and the magnetoresistive effect element 301b connected in parallel and flows into the ground 108, and the remaining high-frequency signal is output via the second port 109b. At this time, due to the spin torque resonance phenomenon, among the high-frequency components of the high-frequency signal input via the first port 109a, frequency components that match the spin torque resonance frequency of the magnetoresistive effect element 301a or the magnetoresistive effect element 301b or that are close to the spin torque resonance frequency of the magnetoresistive effect element 301a or the magnetoresistive effect element 301b are likely to flow into the magnetoresistive effect element 301a or the magnetoresistive effect element 301b connected in parallel and having a combined impedance that is in a low-impedance state and are unlikely to be output via the second port 109b. That is, the magnetoresistive effect device 300 can have a function of a high-frequency filter in which frequencies close to the spin torque resonance frequency of the magnetoresistive effect element 301a or the magnetoresistive effect element 301b correspond to the cutoff frequency band.

Figure 8:
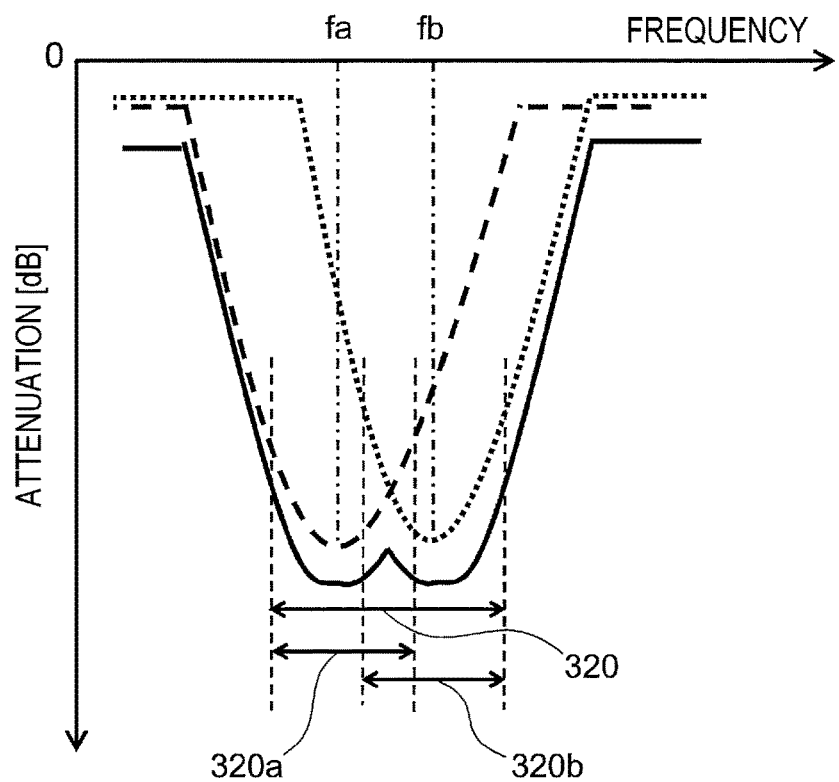
FIG. 8 is a graph illustrating a relationship between a frequency and an attenuation in the magnetoresistive effect device according to the third embodiment.

FIG. 8 is a graph illustrating a relationship between the frequency of the high-frequency signal input to the magnetoresistive effect device 300 and the attenuation. In FIG. 8, the vertical axis represents the attenuation, and the horizontal axis represents the frequency. The two magnetoresistive effect elements 301a and 301b are connected parallel to each other. Therefore, when at least one of the magnetoresistive effect element 301a and the magnetoresistive effect element 301b enters a low-impedance state due to the spin torque resonance phenomenon, the combined impedance of the magnetoresistive effect element 301a and the magnetoresistive effect element 301b connected in parallel becomes lower than that in a case where spin torque resonance does not occur in the magnetoresistive effect element 301a or 301b. Accordingly, the high-frequency signal input via the first port 109a is unlikely to be output via the second port 109b. Therefore, as illustrated in FIG. 8, when the aspect ratios of the shapes of the magnetoresistive effect elements 301a and 301b in plan view are made different so that some frequencies (part of the cutoff frequency band 320a illustrated in FIG. 8) close to the spin torque resonance frequency fa of the magnetoresistive effect element 301a and some frequencies (part of the cutoff frequency band 320b illustrated in FIG. 8) close to the spin torque resonance frequency fb of the magnetoresistive effect element 301b overlap, the magnetoresistive effect device 300 can have a cutoff frequency band (the cutoff frequency band 320 illustrated in FIG. 8) wider than that of the magnetoresistive effect device 100 according to the first embodiment, as illustrated in FIG. 8.

Further, when the direct current supplied to the magnetoresistive effect elements 301a and 301b or the magnetic field applied to the magnetoresistive effect elements 301a and 301b by the magnetic-field applying mechanism 112 is changed, the band can be changed as desired. Accordingly, the magnetoresistive effect device 300 can function as a variable-frequency filter capable of changing the cutoff frequency band as desired.

As described above, the magnetoresistive effect device 300 includes the magnetoresistive effect elements 301a and 301b having different spin torque frequencies and connected parallel to each other, and therefore, the combined impedance of the plurality of magnetoresistive effect elements 301a and 301b connected in parallel can be decreased at frequencies close to a plurality of frequencies identical to the spin torque resonance frequencies of the respective magnetoresistive effect elements. Accordingly, the cutoff frequency band 320 having a specific width can be provided. Further, when the direct current supplied to the magnetoresistive effect elements 301a and 301b or the magnetic field applied to the magnetoresistive effect elements 301a and 301b by the magnetic-field applying mechanism 112 is changed, the position of the cutoff frequency band can be changed. Accordingly, the magnetoresistive effect device 300 can function as a variable-frequency filter having a cutoff frequency band with a specific width and capable of changing the position of the cutoff frequency band.

Further, in the magnetoresistive effect device 300, the aspect ratios of the shapes of the magnetoresistive effect elements 301a and 301b in plan view are different from each other, and therefore, it is possible to manufacture the plurality of magnetoresistive effect elements 301a and 301b having different spin torque resonance frequencies in the same process. That is, the film structures of the plurality of magnetoresistive effect elements can be the same, and therefore, the layers that constitute the plurality of magnetoresistive effect elements 301a and 301b can be formed at once.

Further, the magnetoresistive effect device 300 according to the third embodiment includes the two magnetoresistive effect elements 301a and 301b having different spin torque resonance frequencies and connected parallel to each other; however, the magnetoresistive effect device 300 may include three or more magnetoresistive effect elements having different spin torque resonance frequencies and connected parallel to one another. In this case, the width of the cutoff frequency band can be further increased.

Further, in the magnetoresistive effect device 300 according to the third embodiment, the two magnetoresistive effect elements 301a and 301b have the same film structures; however, the plurality of magnetoresistive effect elements may have different film structures. In this case, the aspect ratios of the shapes of the plurality of magnetoresistive effect elements in plan view may be the same and the film structures may be made different from each other to thereby make the spin torque resonance frequencies of the plurality of magnetoresistive effect elements different from each other.

Further, in the magnetoresistive effect device 300 according to the third embodiment, the magnetic-field applying mechanism 112 applies the same magnetic field to the magnetoresistive effect elements 301a and 301b simultaneously; however, magnetic-field applying mechanisms for individually applying magnetic fields to the respective magnetoresistive effect elements may be provided, as in the second embodiment.

(Fourth Embodiment)

Figure 9:
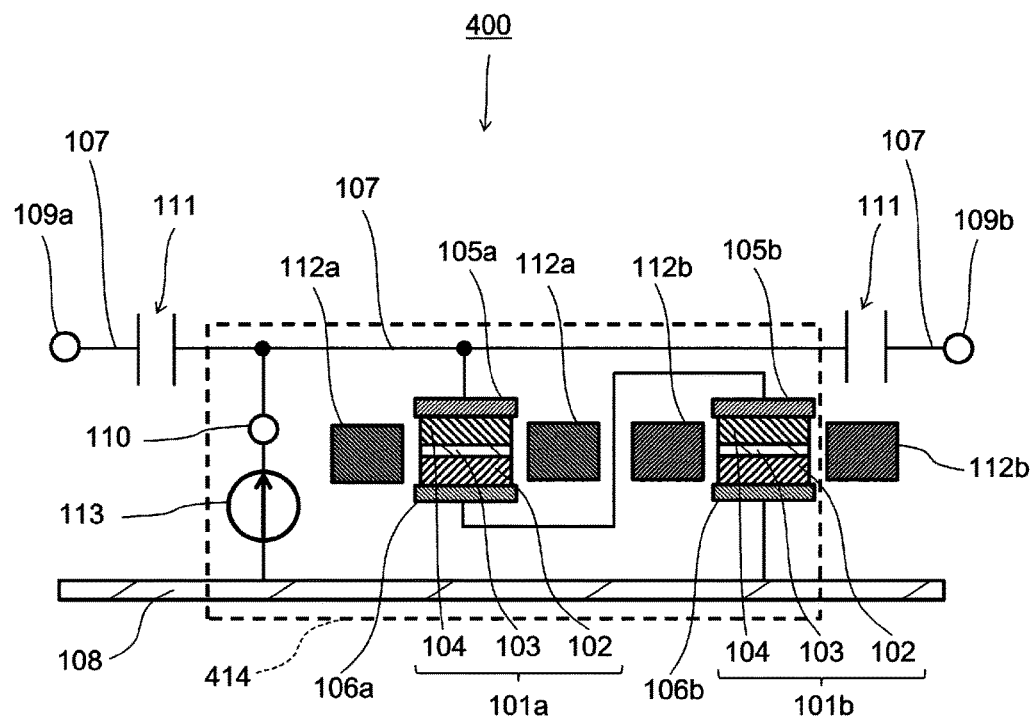
FIG. 9 is a schematic cross-sectional view illustrating a configuration of a magnetoresistive effect device according to a fourth embodiment.

FIG. 9 is a schematic cross-sectional view of a magnetoresistive effect device 400 according to a fourth embodiment of the present invention. Regarding the magnetoresistive effect device 400, differences from the magnetoresistive effect device 100 according to the first embodiment are mainly described, and description of common matters is omitted as appropriate. Any element used in common with the magnetoresistive effect device 100 according to the first embodiment is assigned the same reference numeral, and description thereof is omitted. The magnetoresistive effect device 400 includes the two magnetoresistive effect elements 101a and 101b each including the magnetization fixed layer 102, the spacer layer 103, and the magnetization free layer 104, upper electrodes 105a and 105b, lower electrodes 106a and 106b, the signal line 107, the first port 109a, the second port 109b, the direct-current input terminal 110, the capacitors 111, and the magnetic-field applying mechanisms 112a and 112b, which function as two frequency setting mechanisms. The upper electrode 105a and the lower electrode 106a are arranged with the magnetoresistive effect element 101a sandwiched therebetween. The upper electrode 105b and the lower electrode 106b are arranged with the magnetoresistive effect element 101b sandwiched therebetween. The two magnetoresistive effect elements 101a and 101b have the same structures and are connected in series to each other. The magnetic-field applying mechanisms 112a and 112b each have the same structure as that of the magnetic-field applying mechanism 112 according to the first embodiment. The magnetic-field applying mechanism 112a applies a magnetic field to the magnetoresistive effect element 101a, and the magnetic-field applying mechanism 112b applies a magnetic field to the magnetoresistive effect element 101b. As described above, the magnetoresistive effect device 400 includes the magnetic-field applying mechanisms 112a and 112b, which function as frequency setting mechanisms, so as to be capable of setting the spin torque resonance frequency of each of the magnetoresistive effect elements 101a and 101b individually. The first port 109a and the second port 109b are connected to each other via the signal line 107, and the two magnetoresistive effect elements 101a and 101b connected in series are connected to the signal line 107 and to the ground 108 in parallel to the second port 109b. The direct-current terminal 110 is connected to the signal line 107, and the direct-current source 113 connected to the ground 108 is connected to the direct-current input terminal 110 to thereby form a closed circuit 414, which includes the magnetoresistive effect element 101a, the magnetoresistive effect element 101b, the signal line 107, the ground 108, and the direct-current input terminal 110. The direct current input from the direct-current input terminal 110 flows through the closed circuit 414 and is supplied to the magnetoresistive effect element 101a and to the magnetoresistive effect element 101b. The capacitors 111 are connected in series to the first port 109a and to the second port 109b via the signal line 107 between the closed circuit 414 and the first port 109a and between the closed circuit 414 and the second port 109b.

Part of the high-frequency signal input via the first port 109a passes through the magnetoresistive effect element 101a and the magnetoresistive effect element 101b connected in series and flows into the ground 108, and the remaining high-frequency signal is output via the second port 109b. At this time, due to the spin torque resonance phenomenon, among the high-frequency components of the high-frequency signal input via the first port 109a, frequency components that match the spin torque resonance frequency of the magnetoresistive effect element 101a or the magnetoresistive effect element 101b or that are close to the spin torque resonance frequency of the magnetoresistive effect element 101a or the magnetoresistive effect element 101b are likely to flow into the magnetoresistive effect elements 101a and 101b connected in series and having a combined impedance that is in a low-impedance state and are unlikely to be output via the second port 109b. That is, the magnetoresistive effect device 400 can have a function of a high-frequency filter in which frequencies close to the spin torque resonance frequency of the magnetoresistive effect element 101a or the magnetoresistive effect element 101b correspond to the cutoff frequency band.

Figure 10:
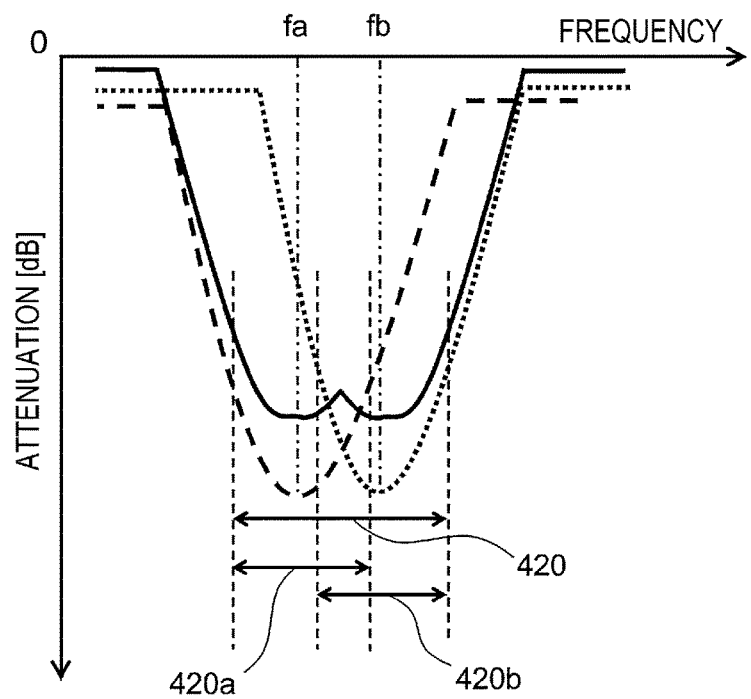
FIG. 10 is a graph illustrating a relationship between a frequency and an attenuation in the magnetoresistive effect device according to the fourth embodiment.

FIG. 10 is a graph illustrating a relationship between the frequency of the high-frequency signal input to the magnetoresistive effect device 400 and the attenuation. In FIG. 10, the vertical axis represents the attenuation, and the horizontal axis represents the frequency. As illustrated in FIG. 10, for example, the spin torque resonance frequency of the magnetoresistive effect element 101a is represented by fa, and the spin torque resonance frequency of the magnetoresistive effect element 101b is represented by fb. Then, in a case where the strength of the magnetic field applied to the magnetoresistive effect element 101b is higher than the strength of the magnetic field applied to the magnetoresistive effect element 101a, fa<fb is satisfied. Here, the two magnetoresistive effect elements 101a and 101b are connected in series to each other. Therefore, when at least one of the magnetoresistive effect element 101a and the magnetoresistive effect element 101b enters a low-impedance state due to the spin torque resonance phenomenon, the combined impedance of the magnetoresistive effect element 101a and the magnetoresistive effect element 101b connected in series becomes lower than that in a case where spin torque resonance does not occur in the magnetoresistive effect element 101a or 101b. Accordingly, the high-frequency signal input via the first port 109a is unlikely to be output via the second port 109b. Therefore, as illustrated in FIG. 10, when the strengths of the magnetic fields applied to the magnetoresistive effect elements 101a and 101b by the magnetic-field applying mechanisms 112a and 112b are adjusted so that some frequencies (part of the cutoff frequency band 420a illustrated in FIG. 10) close to the spin torque resonance frequency fa of the magnetoresistive effect element 101a and some frequencies (part of the cutoff frequency band 420b illustrated in FIG. 5) close to the spin torque resonance frequency fb of the magnetoresistive effect element 101b overlap, the magnetoresistive effect device 400 can have a cutoff frequency band (the cutoff frequency band 420 illustrated in FIG. 10) wider than that of the magnetoresistive effect device 100 according to the first embodiment, as illustrated in FIG. 10. Further, when the magnetic fields applied to the magnetoresistive effect elements 101a and 101b by the magnetic-field applying mechanisms 112a and 112b are changed, the band can be changed as desired. Accordingly, the magnetoresistive effect device 400 can function as a variable-frequency filter capable of changing the cutoff frequency band as desired.

As described above, the magnetoresistive effect device 400 includes the magnetic-field applying mechanisms 112a and 112b, which function as frequency setting mechanisms, so as to be capable of setting the spin torque resonance frequency of each of the magnetoresistive effect elements 101a and 101b individually. Therefore, the magnetoresistive effect device 400 can control the spin torque resonance frequencies of the respective magnetoresistive effect elements individually. Further, the magnetoresistive effect elements 101a and 101b are connected in series to each other, and therefore, the combined impedance of the plurality of magnetoresistive effect elements 101a and 101b connected in series can be decreased at frequencies close to a plurality of frequencies identical to the spin torque resonance frequencies of the respective magnetoresistive effect elements. Accordingly, the cutoff frequency band 420 having a specific width can be provided. Further, when the direct current supplied to the magnetoresistive effect elements 101a and 101b is changed or the magnetic fields applied to the magnetoresistive effect elements 101a and 101b by the magnetic-field applying mechanisms 112a and 112b are changed, the band can be changed as desired. Accordingly, the magnetoresistive effect device 400 can function as a variable-frequency filter having a cutoff frequency band with a specific width and capable of changing the cutoff frequency band as desired.

The magnetoresistive effect device 400 according to the fourth embodiment includes the two magnetoresistive effect elements 101a and 101b connected in series to each other and the two frequency setting mechanisms (magnetic-field applying mechanisms 112a and 112b) so as to be capable of setting the spin torque resonance frequencies of the respective magnetoresistive effect elements individually. Alternatively, the magnetoresistive effect device 400 may include three or more magnetoresistive effect elements connected in series to one another and three or more frequency setting mechanisms (magnetic-field applying mechanisms) so as to be capable of setting the spin torque resonance frequencies of the respective magnetoresistive effect elements individually. In this case, the width of the cutoff frequency band can be further increased.

Further, in the magnetoresistive effect device 400 according to the fourth embodiment, the two magnetoresistive effect elements 101a and 101b have the same structures; however, the plurality of magnetoresistive effect elements may have different structures.

(Fifth Embodiment)

Figure 11:
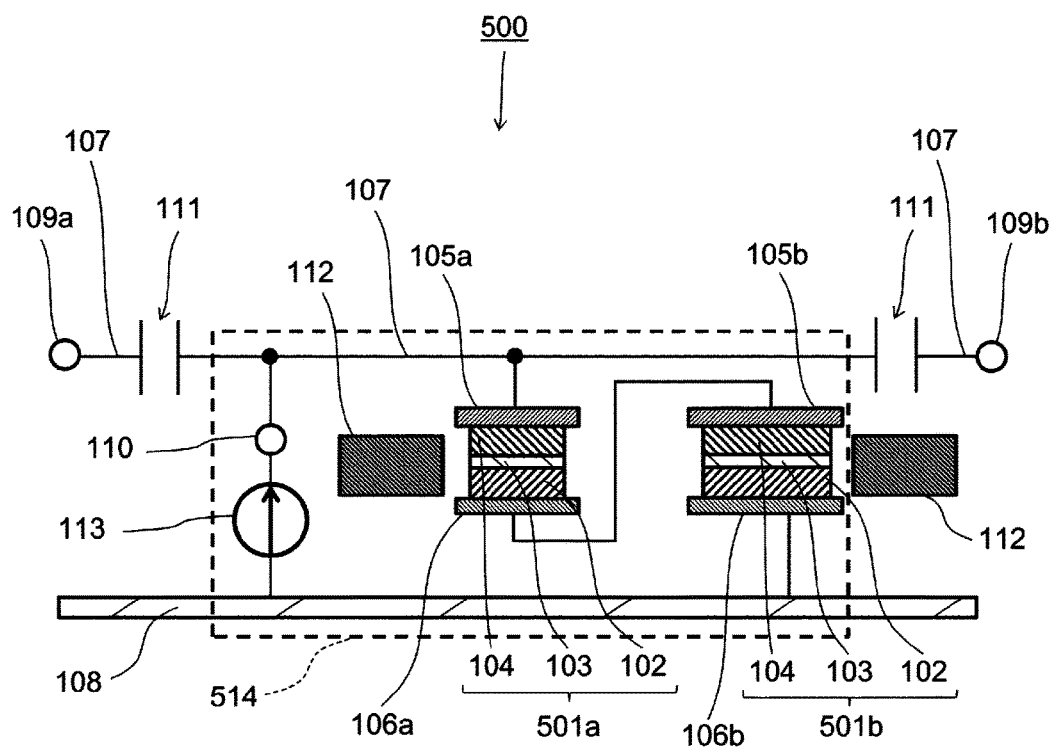
FIG. 11 is a schematic cross-sectional view illustrating a configuration of a magnetoresistive effect device according to a fifth embodiment.

FIG. 11 is a schematic cross-sectional view of a magnetoresistive effect device 500 according to a fifth embodiment of the present invention. Regarding the magnetoresistive effect device 500, differences from the magnetoresistive effect device 100 according to the first embodiment are mainly described, and description of common matters is omitted as appropriate. Any element used in common with the magnetoresistive effect device 100 according to the first embodiment is assigned the same reference numeral, and description thereof is omitted. The magnetoresistive effect device 500 includes two magnetoresistive effect elements 501a and 501b each including the magnetization fixed layer 102, the spacer layer 103, and the magnetization free layer 104, the upper electrodes 105a and 105b, the lower electrodes 106a and 106b, the signal line 107, the first port 109a, the second port 109b, the direct-current input terminal 110, the capacitors 111, and the magnetic-field applying mechanism 112, which functions as a frequency setting mechanism. The upper electrode 105a and the lower electrode 106a are arranged with the magnetoresistive effect element 501a sandwiched therebetween. The upper electrode 105b and the lower electrode 106b are arranged with the magnetoresistive effect element 501b sandwiched therebetween. The magnetoresistive effect elements 501a and 501b are connected in series to each other. The magnetoresistive effect elements 501a and 501b have different spin torque resonance frequencies in a state where the same magnetic field is applied and a direct current having the same current density is supplied. More specifically, the magnetoresistive effect elements 501a and 501b have the same film structures and have rectangular shapes in plan view; however, the aspect ratios of the shapes in plan view are different from each other. Here, "the same film structure" means that the material and film thickness of each layer constituting each of the magnetoresistive effect elements are the same and the order in which the respective layers are stacked is the same in the magnetoresistive effect elements. Further, "shape in plan view" is a shape viewed from above a plane perpendicular to a direction in which the layers constituting each of the magnetoresistive effect elements are stacked. Further, "the aspect ratio of a shape in plan view" is the ratio of the length of the long sides relative to the length of the short sides of a rectangle that is circumscribed about the shape of each of the magnetoresistive effect elements with the smallest area in plan view.

The first port 109a and the second port 109b are connected to each other via the signal line 107, and the magnetoresistive effect element 501a and the magnetoresistive effect element 501b are connected to the signal line 107 and to the ground 108 in parallel to the second port 109b. The direct-current input terminal 110 is connected to the signal line 107, and the direct-current source 113 connected to the ground 108 is connected to the direct-current input terminal 110 to thereby form a closed circuit 514, which includes the magnetoresistive effect element 501a, the magnetoresistive effect element 501b, the signal line 107, the ground 108, and the direct-current input terminal 110. The direct current input from the direct-current input terminal 110 flows through the closed circuit 514 and is supplied to the magnetoresistive effect element 501a and to the magnetoresistive effect element 501b. The capacitors 111 are connected in series to the first port 109a and to the second port 109b via the signal line 107 between the closed circuit 514 and the first port 109a and between the closed circuit 514 and the second port 109b.

The magnetic-field applying mechanism 112 is disposed close to the magnetoresistive effect elements 501a and 501b and applies a magnetic field having the same strength to the magnetoresistive effect elements 501a and 501b simultaneously. The magnetic-field applying mechanism 112 changes the magnetic field to be applied to the magnetoresistive effect elements 501a and 501b to thereby change the effective magnetic field in the magnetization free layer 104 in each of the magnetoresistive effect elements 501a and 501b and enable the spin torque resonance frequency of each of the magnetoresistive effect elements 501a and 501b to be changed.

Figure 12:
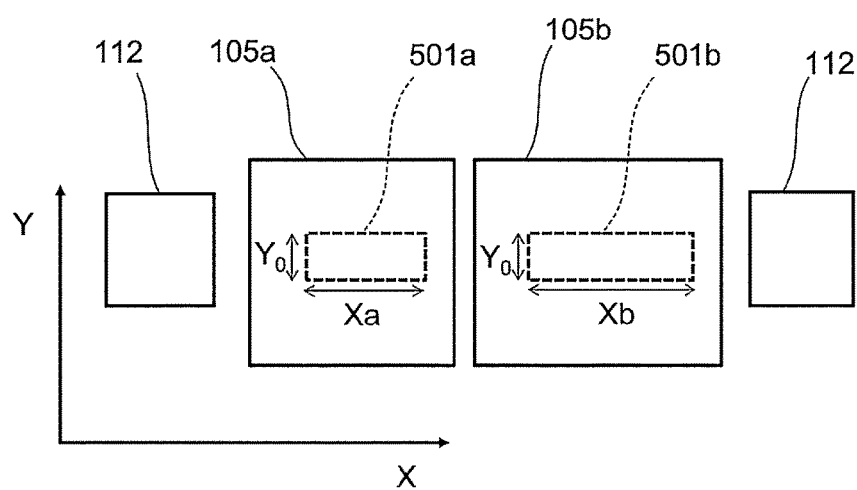
FIG. 12 is a top view of the magnetoresistive effect device according to the fifth embodiment.

The film structures of the magnetoresistive effect elements 501a and 501b are the same as that of the magnetoresistive effect element 101 according to the first embodiment. FIG. 12 is a top view of the magnetoresistive effect device 500. As illustrated in FIG. 12, the lengths of the short sides of the shapes of the magnetoresistive effect elements 501a and 501b in plan view in the Y direction are the same and equal to $Y_0$; however, the length Xa of the long sides of the shape of the magnetoresistive effect element 501a in plan view in the X direction is different from the length Xb of the long sides of the shape of the magnetoresistive effect element 501b in plan view in the X direction, and Xa<Xb is satisfied. Therefore, the aspect ratio ($Xb/Y_0$) of the shape of the magnetoresistive effect element 501b in plan view is larger than the aspect ratio ($Xa/Y_0$) of the shape of the magnetoresistive effect element 501a in plan view. A state where the same magnetic field is applied and a direct current having the same current density is supplied to a magnetoresistive effect element is assumed. Then, as the aspect ratio of the shape of the magnetoresistive effect element in plan view increases, the spin torque resonance frequency of the magnetoresistive effect element increases. Therefore, the spin torque resonance frequency fb of the magnetoresistive effect element 501b is higher than the spin torque resonance frequency fa of the magnetoresistive effect element 501a. As described above, when the aspect ratios of the shapes of a plurality of magnetoresistive effect elements in plan view are made different from each other, the spin torque resonance frequencies can be made different from each other even if the film structures are the same. Accordingly, it is possible to manufacture a plurality of magnetoresistive effect elements having different spin torque resonance frequencies in the same film forming process. That is, the film structures of the plurality of magnetoresistive effect elements can be the same, and therefore, the layers that constitute the plurality of magnetoresistive effect elements can be formed at once. Further, in the magnetoresistive effect device 500, the magnetoresistive effect elements 501a and 501b are connected in series to each other, and the area of a cross section perpendicular to the direction in which the direct current flows in the magnetoresistive effect element 501a is smaller than that in the magnetoresistive effect element 501b, and therefore, the current density of the supplied direct current in the magnetoresistive effect element 501a is higher than that in the magnetoresistive effect element 501b. Accordingly, in a case where the spin torque resonance frequency of a magnetoresistive effect element decreases as the current density of the supplied direct current increases or in a case where the influence of a difference in the aspect ratio of the shape of the magnetoresistive effect element in plan view on the spin torque resonance frequency of the magnetoresistive effect element is larger than the influence of a difference in the current density of the supplied direct current on the spin torque resonance frequency of the magnetoresistive effect element, the aspect ratio of the shape in plan view is made different in the magnetoresistive effect element 501a and the magnetoresistive effect element 501b to thereby satisfy fa<fb.

Part of the high-frequency signal input via the first port 109a passes through the magnetoresistive effect element 501a and the magnetoresistive effect element 501b connected in series and flows into the ground 108, and the remaining high-frequency signal is output via the second port 109b. At this time, due to the spin torque resonance phenomenon, among the high-frequency components of the high-frequency signal input via the first port 109a, frequency components that match the spin torque resonance frequency of the magnetoresistive effect element 501a or the magnetoresistive effect element 501b or that are close to the spin torque resonance frequency of the magnetoresistive effect element 501a or the magnetoresistive effect element 501b are likely to flow into the magnetoresistive effect elements 501a and 501b connected in series and having a combined impedance that is in a low-impedance state and are unlikely to be output via the second port 109b. That is, the magnetoresistive effect device 500 can have a function of a high-frequency filter in which frequencies close to the spin torque resonance frequency of the magnetoresistive effect element 501a or the magnetoresistive effect element 501b correspond to the cutoff frequency band.

Figure 13:
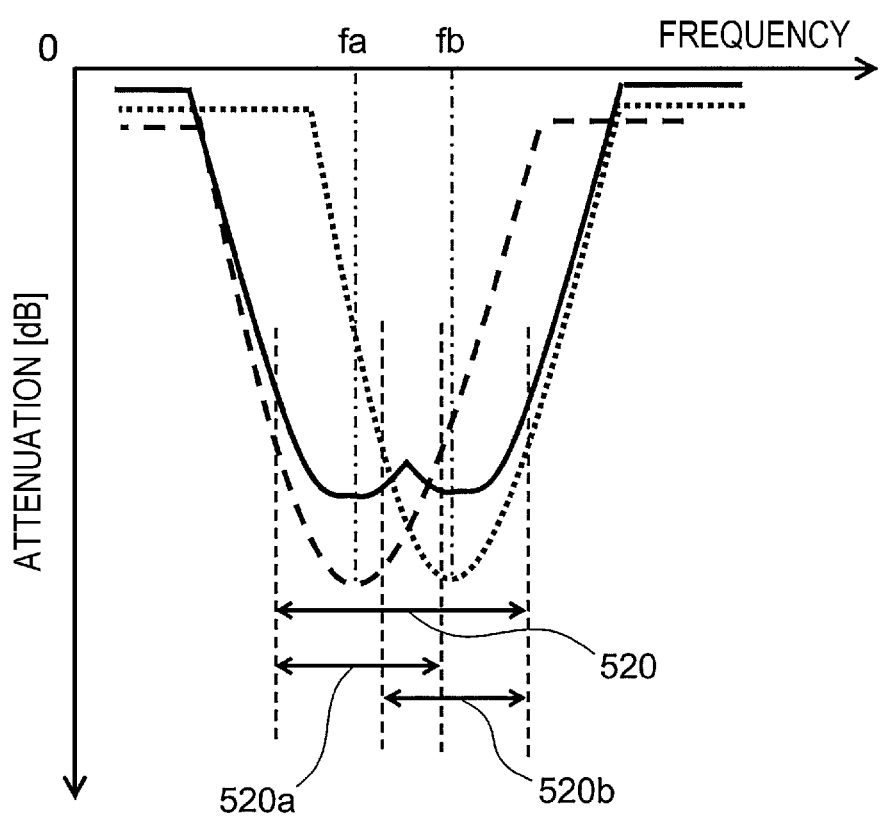
FIG. 13 is a graph illustrating a relationship between a frequency and an attenuation in the magnetoresistive effect device according to the fifth embodiment.

FIG. 13 is a graph illustrating a relationship between the frequency of the high-frequency signal input to the magnetoresistive effect device 500 and the attenuation. In FIG. 13, the vertical axis represents the attenuation, and the horizontal axis represents the frequency. The two magnetoresistive effect elements 501a and 501b are connected in series to each other. Therefore, when at least one of the magnetoresistive effect element 501a and the magnetoresistive effect element 501b enters a low-impedance state due to the spin torque resonance phenomenon, the combined impedance of the magnetoresistive effect element 501a and the magnetoresistive effect element 501b connected in series becomes lower than that in a case where spin torque resonance does not occur in the magnetoresistive effect element 501a or 501b. Accordingly, the high-frequency signal input via the first port 109a is unlikely to be output via the second port 109b. Therefore, as illustrated in FIG. 13, when the aspect ratios of the shapes of the magnetoresistive effect elements 501a and 501b in plan view are made different so that some frequencies (part of the cutoff frequency band 520a illustrated in FIG. 13) close to the spin torque resonance frequency fa of the magnetoresistive effect element 501a and some frequencies (part of the cutoff frequency band 520b illustrated in FIG. 13) close to the spin torque resonance frequency fb of the magnetoresistive effect element 501b overlap, the magnetoresistive effect device 500 can have a cutoff frequency band (the cutoff frequency band 520 illustrated in FIG. 13) wider than that of the magnetoresistive effect device 100 according to the first embodiment, as illustrated in FIG. 13.

Further, when the direct current supplied to the magnetoresistive effect elements 501a and 501b or the magnetic field applied to the magnetoresistive effect elements 501a and 501b by the magnetic-field applying mechanism 112 is changed, the band can be changed as desired. Accordingly, the magnetoresistive effect device 500 can function as a variable-frequency filter capable of changing the cutoff frequency band as desired.

As described above, the magnetoresistive effect device 500 includes the magnetoresistive effect elements 501a and 501b having different spin torque frequencies and connected in series to each other, and therefore, the combined impedance of the plurality of magnetoresistive effect elements 501a and 501b connected in series can be decreased at frequencies close to a plurality of frequencies identical to the spin torque resonance frequencies of the respective magnetoresistive effect elements. Accordingly, the cutoff frequency band 520 having a specific width can be provided. Further, when the direct current supplied to the magnetoresistive effect elements 501a and 501b or the magnetic field applied to the magnetoresistive effect elements 501a and 501b by the magnetic-field applying mechanism 112 is changed, the position of the cutoff frequency band can be changed. Accordingly, the magnetoresistive effect device 500 can function as a variable-frequency filter having a cutoff frequency band with a specific width and capable of changing the position of the cutoff frequency band.

Further, in the magnetoresistive effect device 500, the aspect ratios of the shapes of the magnetoresistive effect elements 501a and 501b in plan view are different from each other, and therefore, it is possible to manufacture the plurality of magnetoresistive effect elements 501a and 501b having different spin torque resonance frequencies in the same process. That is, the film structures of the plurality of magnetoresistive effect elements can be the same, and therefore, the layers that constitute the plurality of magnetoresistive effect elements 501a and 501b can be formed at once.

Further, the magnetoresistive effect device 500 according to the fifth embodiment includes the two magnetoresistive effect elements 501a and 501b having different spin torque resonance frequencies and connected in series to each other; however, the magnetoresistive effect device 500 may include three or more magnetoresistive effect elements having different spin torque resonance frequencies and connected in series to one another. In this case, the width of the cutoff frequency band can be further increased.

Further, in the magnetoresistive effect device 500 according to the fifth embodiment, the two magnetoresistive effect elements 501a and 501b have the same film structures; however, the plurality of magnetoresistive effect elements may have different film structures. In this case, the aspect ratios of the shapes of the plurality of magnetoresistive effect elements in plan view may be the same and the film structures may be made different from each other to thereby make the spin torque resonance frequencies of the plurality of magnetoresistive effect elements different from each other.

Further, in the magnetoresistive effect device 500 according to the fifth embodiment, the magnetic-field applying mechanism 112 applies the same magnetic field to the magnetoresistive effect elements 501a and 501b simultaneously; however, magnetic-field applying mechanisms for individually applying magnetic fields to the respective magnetoresistive effect elements may be provided, as in the second embodiment.

Preferred embodiments of the present invention have been described above. In addition to the above-described embodiments, the present invention can be further modified. For example, the description has been given in the first, third, and fifth embodiments under the example assumption that the magnetoresistive effect device 100 (300, 500) includes the magnetic-field applying mechanism 112 as a frequency setting mechanism (effective-magnetic-field setting mechanism); however, the frequency setting mechanism (effective-magnetic-field setting mechanism) may be one of the other example mechanisms as described below. For example, when an electric field is applied to a magnetoresistive effect element and the electric field is changed, the anisotropic magnetic field $H_k$ in the magnetization free layer is changed, and the effective magnetic field in the magnetization free layer is changed. Accordingly, the spin torque resonance frequency of the magnetoresistive effect element can be changed. In this case, a mechanism that applies the electric field to the magnetoresistive effect element functions as the frequency setting mechanism (effective-magnetic-field setting mechanism). Alternatively, a piezoelectric body is provided close to the magnetization free layer, and an electric field is applied to the piezoelectric body to deform the piezoelectric body and bend the magnetization free layer. Then, the anisotropic magnetic field $H_k$ in the magnetization free layer is changed, and the effective magnetic field in the magnetization free layer is changed. Accordingly, the spin torque resonance frequency of the magnetoresistive effect element can be changed. In this case, the piezoelectric body and a mechanism that applies the electric field to the piezoelectric body function as the frequency setting mechanism (effective-magnetic-field setting mechanism). Alternatively, a control film that is an antiferromagnetic body or a ferromagnetic body having a magneto-electric effect is provided so as to be magnetically coupled to the magnetization free layer, a magnetic field and an electric field are applied to the control film, and at least one of the magnetic field and the electric field applied to the control film is changed. Then, the exchange coupling magnetic field $H_{EX}$ in the magnetization free layer is changed, and the effective magnetic field in the magnetization free layer is changed. Accordingly, the spin torque resonance frequency of the magnetoresistive effect element can be changed. In this case, the control film, a mechanism that applies the magnetic field to the control film, and a mechanism that applies the electric field to the control film function as the frequency setting mechanism (effective-magnetic-field setting mechanism).

Further, in a case where the spin torque resonance frequency of each magnetoresistive effect element is set to a desired frequency without a frequency setting mechanism (without a magnetic field applied by the magnetic-field applying mechanism 112), a frequency setting mechanism (magnetic-field applying mechanism 112) need not be provided.

REFERENCE SIGNS LIST 100, 200, 300, 400, 500 magnetoresistive effect device
101, 101a, 101b, 301a, 301b, 501a, 501b magnetoresistive effect element
102 magnetization fixed layer
103 spacer layer
104 magnetization free layer
105, 105a, 105b upper electrode 106, 106a, 106b lower electrode
107 signal line
108 ground
109a first port
109b second port
110 direct-current input terminal
111 capacitor
112, 112a, 112b magnetic-field applying mechanism
113 direct-current source
114, 214, 314, 414, 514 closed circuit

The invention claimed is:

1. A magnetoresistive effect device comprising:
a first magnetoresistive effect element and a second magnetoresistive effect element each including a magnetization fixed layer, a spacer layer, and a magnetization free layer in which a magnetization direction is changeable;
a first port via which a high-frequency signal is input;
a second port via which a high-frequency signal is output;
a signal line; and
a direct-current input terminal, wherein
the first port and the second port are connected to each other via the signal line to form a connection of the first port and the second port,
the first port, the first magnetoresistive effect element and the second magnetoresistive effect element are connected in series to form a series connection with the first magnetoresistive effect element connected to the first port via the signal line and with the second magnetoresistive effect element connected to the first magnetoresistive effect element, such that the first magnetoresistive effect element is between the first port and the second magnetoresistive effect element in the series connection of the first port, the first magnetoresistive effect element and the second magnetoresistive effect element,
the series connection of the first port, the first magnetoresistive effect element and the second magnetoresistive effect element is in parallel to the connection of the first port and the second port, and
the direct-current input terminal is connected to the signal line.

2. The magnetoresistive effect device according to claim 1, further comprising at least one frequency setting mechanism capable of setting a spin torque resonance frequency of each of the first magnetoresistive effect element and the second magnetoresistive effect element.

3. The magnetoresistive effect device according to claim 2, wherein the frequency setting mechanism is an effective-magnetic-field setting mechanism capable of setting an effective magnetic field in the magnetization free layer of each of the first magnetoresistive effect element and the second magnetoresistive effect element, and is capable of changing the spin torque resonance frequency of each of the first magnetoresistive effect element and the second magnetoresistive effect element by changing the effective magnetic field.

4. The magnetoresistive effect device according to claim 2, wherein the at least one frequency setting mechanism includes a plurality of frequency setting mechanisms so as to be capable of setting respective spin torque resonance frequencies of the first magnetoresistive effect element and the second magnetoresistive effect element individually.

5. The magnetoresistive effect device according to claim 1, wherein the first magnetoresistive effect element and the second magnetoresistive effect element have different spin torque resonance frequencies.

6. The magnetoresistive effect device according to claim 5, wherein the first magnetoresistive effect element and the second magnetoresistive effect element have shapes for which aspect ratios differ from each other in plan view.

7. The magnetoresistive effect device according to claim 1, wherein a magnetoresistive effect element connected in series to the first port and to the second port via the signal line is not present.

8. The magnetoresistive effect device according to claim 1, further comprising a capacitor, wherein
a closed circuit including the first magnetoresistive effect element, the second magnetoresistive effect element, the signal line a ground, and the direct-current input terminal is to be formed, and
the capacitor is connected in series to the first port and to the second port via the signal line (i) between the closed circuit and the first port; (ii) between the closed circuit and the second port; or (iii) between the closed circuit and the first port and between the closed circuit and the second port.

9. The magnetoresistive effect device according to claim 1, further comprising a capacitor, wherein
a closed circuit including the first magnetoresistive effect element, the second magnetoresistive effect element, the signal line, a ground, and the direct-current input terminal is to he formed, and
the capacitor is connected in series to the first port and to the second port via the signal line at least between the closed circuit and the first port or between the closed circuit and the second port.

* * * * *